(12) United States Patent
Kawanami et al.

(10) Patent No.: US 9,023,239 B2
(45) Date of Patent: May 5, 2015

(54) INK FOR ORGANIC LIGHT-EMITTING ELEMENT AND A METHOD FOR PRODUCING THE SAME

(75) Inventors: Yuko Kawanami, Osaka (JP); Shinichiro Ishino, Osaka (JP); Tomoki Masuda, Osaka (JP); Hirotaka Nanno, Kyoto (JP); Noriyuki Matsusue, Osaka (JP)

(73) Assignees: Joled Inc., Tokyo (JP); Sumitomo Chemical Company, Limited, Tokyo (JP)

( * ) Notice: Subject to any disclaimer, the term of this patent is extended or adjusted under 35 U.S.C. 154(b) by 11 days.

(21) Appl. No.: 13/641,892

(22) PCT Filed: Sep. 28, 2011

(86) PCT No.: PCT/JP2011/005467
§ 371 (c)(1),
(2), (4) Date: Oct. 18, 2012

(87) PCT Pub. No.: WO2013/046264
PCT Pub. Date: Apr. 4, 2013

(65) Prior Publication Data
US 2013/0139720 A1    Jun. 6, 2013

(51) Int. Cl.
*H01L 51/50* (2006.01)
*H05B 33/10* (2006.01)
*H05B 33/12* (2006.01)
*H05B 33/22* (2006.01)
*C09D 11/02* (2014.01)
*H01L 51/00* (2006.01)
*H01L 27/32* (2006.01)

(52) U.S. Cl.
CPC ............. *C09D 11/02* (2013.01); *H01L 51/5012* (2013.01); *H01L 27/3246* (2013.01); *H01L 2251/55* (2013.01); *H01L 51/0005* (2013.01)

(58) Field of Classification Search
USPC .......................... 252/301.16, 519.21, 519.33
See application file for complete search history.

(56) References Cited

U.S. PATENT DOCUMENTS 5,443,922 A    8/1995  Nishizaki et al.
6,825,061 B2 * 11/2004  Hokari et al. ................... 438/99
(Continued)

FOREIGN PATENT DOCUMENTS

JP    05-163488    6/1993
JP    2003-266003    9/2003
(Continued)

OTHER PUBLICATIONS

Search report from International Application No. PCT/JP2011/005467, mail date is Jan. 10, 2012.

*Primary Examiner* — Carol M Koslow
(74) *Attorney, Agent, or Firm* — Greenblum & Bernstein, P.L.C.

(57) ABSTRACT

An ink for an organic light-emitting element includes a first solvent, a second solvent, and a functional material. The first and second solvents have equal or similar boiling points. The first solvent is such that an imitatively formed functional layer formed by replacing the second solvent with the first solvent, in a light-emitting region of an organic light-emitting element, is thicker at both end portions than at a central portion and the top surfaces of the end portions are positioned higher than the top surface of the central portion. The second solvent is such that an imitatively formed functional layer formed by replacing the first solvent with the second solvent, in a light-emitting region of an organic light-emitting element, is thicker at a central portion than at both end portions and the top surface of the central portion is positioned higher than the top surfaces of the end portions.

18 Claims, 24 Drawing Sheets

(56) References Cited

U.S. PATENT DOCUMENTS

| | | | |
|---|---|---|---|
| 8,308,979 B2 | 11/2012 | Ishino et al. | |
| 2008/0114151 A1 | 5/2008 | Shirasawa et al. | |
| 2010/0243960 A1 | 9/2010 | Matsue et al. | |

FOREIGN PATENT DOCUMENTS

| | | |
|---|---|---|
| JP | 2004-355913 | 12/2004 |
| JP | 2005-322437 | 11/2005 |
| JP | 2006-219663 | 8/2006 |
| JP | 2007-069140 | 3/2007 |
| JP | 2007-265823 | 10/2007 |
| JP | 2008-238023 | 10/2008 |
| JP | 2009-054608 | 3/2009 |
| JP | 2009-140922 | 6/2009 |
| JP | 2010-161070 | 7/2010 |
| JP | 2010-177156 | 8/2010 |
| WO | 2009/084413 | 7/2009 |

* cited by examiner

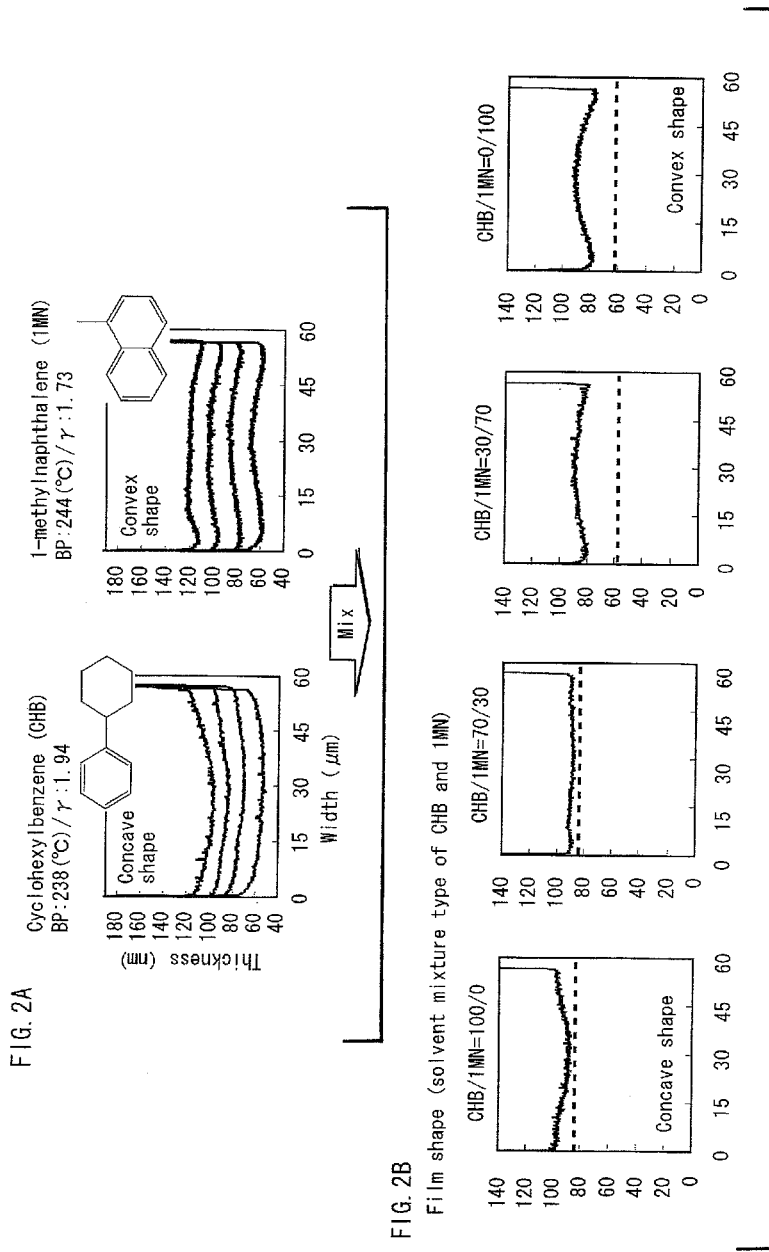

Film shape (solvent mixture type of HB and 1MN)

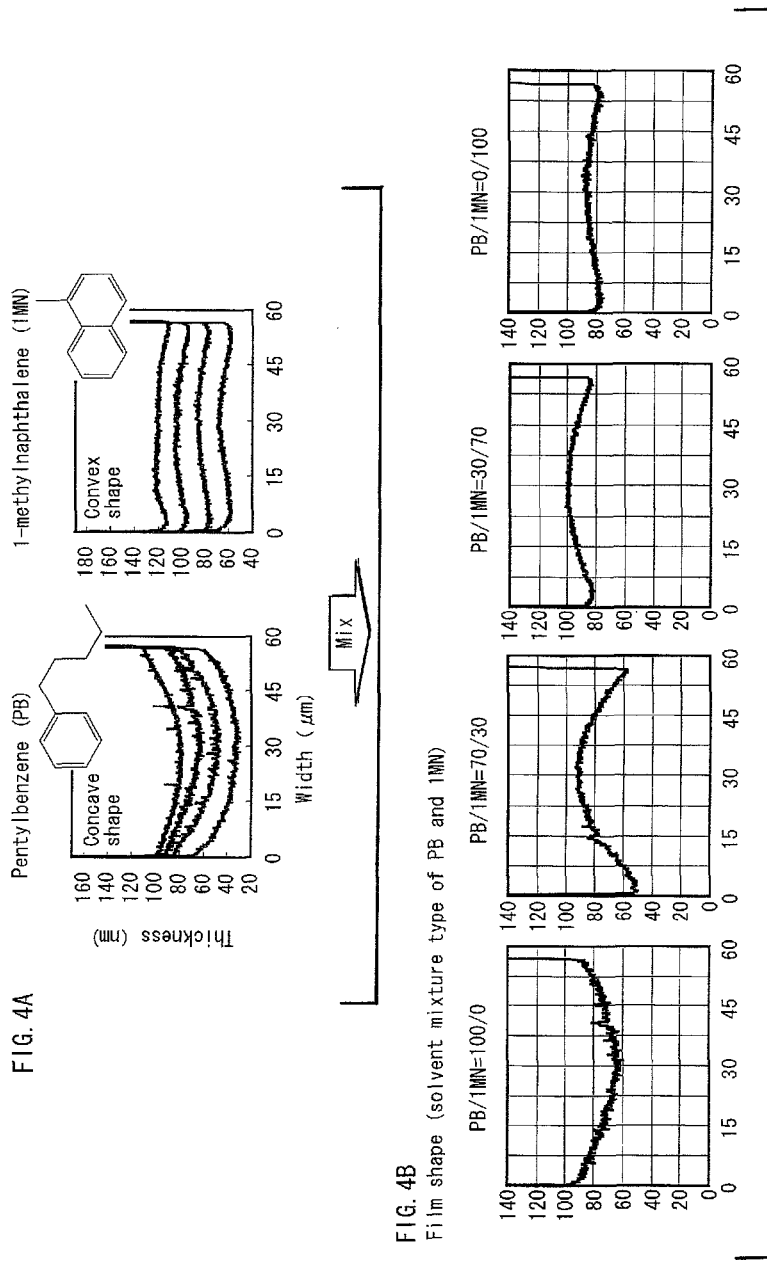

Film shape (solvent mixture type of CHB and HB)

Planarity degree $Pl = dc - (dL+dR)/2$
Planarity degree $Pl_M = dc - (d_{ML}+d_{MR})/2$

FIG. 12

| Solvent | Boiling point (°C) | Solvent | Boiling point (°C) | Difference in boiling points (°C) | Judgment | Supplementary Information |
|---|---|---|---|---|---|---|
| CHB | 238 | HB | 235 | 3 | ○ | Concave shape (γ > 1.9 for both solvents) |
| CHB | 238 | 1MN | 244 | 6 | ○ | Planar |
| HB | 235 | 1MN | 244 | 9 | ○ | Planar |
| CHB | 238 | PB | 202 | 36 | × | Convex shape (PB volatilized and viscosity increased) |
| PB | 202 | 1MN | 244 | 42 | × | Convex shape (PB volatilized and viscosity increased) |
| CHB | 238 | PT | 280 | 42 | × | Planar (PT has high boiling point and high viscosity) |
| CHB | 238 | MT | 178 | 60 | × | Convex shape (MT volatilized and viscosity increased) |

FIG. 13

Magangoni Number (Ma)

$$Ma = \frac{-\Delta T \cdot H \cdot \left(\frac{\partial \sigma}{\partial T}\right)}{\eta \cdot \alpha}$$

$\Delta T$ : Series temperature difference(K)
 $H$ : Characteristic length(m)
 $\sigma$ : Surface tension(N/m)
 $\eta$ : Viscosity coefficient(Pa·s)
 $\alpha$ : Thermal diffusivity(m²/c)

FIG. 14

| $\gamma$ [Surface tension $\sigma$ (mNm⁻¹) /Viscosity $\eta$ (mPas)] | <1.9 | 1.9 | >1.9 |
|---|---|---|---|
| Film shape | Convex shape | Planar shape | Concave shape |
| Planarity degree Pl [dc−(dL+dR)/2] | >0 | 0 | <0 |

FIG. 15

| Solvent | | Viscosity (mPas) | Surface tension (mNm-1) | Planarity degree | | γ |
|---|---|---|---|---|---|---|
| | | | | PI | PIM | |
| PB | | 7.9 | 28.4 | -15.2 | -5.4 | 3.59 |
| HB | | 13.2 | 30.0 | -14.7 | -4.3 | 2.27 |
| NB | | 18.3 | 30.0 | 0.9 | 0.4 | 1.64 |
| BPE | | 10.6 | 32.0 | -14.9 | -4.5 | 3.02 |
| MT | | 5.7 | 33.5 | -7.5 | -1.8 | 5.88 |
| CHB | | 17.7 | 34.4 | -7.7 | -2.4 | 1.94 |
| PT | | 24.6 | 38.0 | 1.8 | 0.8 | 1.54 |
| 1MN | | 22.1 | 38.3 | 7.7 | 2.5 | 1.73 |
| CHB/1MN | 30/70 | 20.0 | 37.3 | 5.4 | 1.6 | 1.87 |
| CHB/1MN | 70/30 | 18.3 | 35.7 | -3.7 | -1.0 | 1.95 |
| HB/CHB | 30/70 | 16.0 | 33.2 | -11.2 | -3.6 | 2.08 |
| HB/CHB | 70/30 | 14.5 | 31.4 | -12.4 | -4.0 | 2.16 |
| HB/1MN | 70/30 | 15.1 | 32.5 | -12.2 | -2.6 | 2.15 |

FIG. 17

| Solvent | | Concentration(w/v%) F8-F6 | Viscosity (mPas) | Surface tension (mNm⁻¹) | Film thickness: 80 nm | | Film thickness: 5 nm | | Film thickness: 90 nm | | γ |
|---|---|---|---|---|---|---|---|---|---|---|---|
| | | | | | PI (nm) | PIM (nm) | PI (nm) | PIM (nm) | PI (nm) | PIM (nm) | |
| PB | | | 7.9 | 28.4 | -15.2 | -5.4 | -2.5 | -0.4 | -13.5 | -5.9 | 3.59 |
| HB | | | 13.2 | 30.0 | -3.8 | -15.0 | -2.1 | -0.7 | -14.2 | -3.2 | 2.27 |
| BPE | | | 10.6 | 32.0 | -14.9 | -4.5 | -2.3 | -0.8 | -13.3 | -3.7 | 3.02 |
| MT | | | 5.7 | 33.5 | -4.5 | -1.6 | -2.1 | -0.7 | -0.8 | -0.4 | 5.88 |
| PT | | | 24.6 | 38.0 | 1.8 | 0.8 | 0.1 | 0.2 | 2.0 | 0.6 | 1.54 |
| NB | | 1.2 | 18.3 | 30.0 | 0.8 | 0.5 | 0.1 | 0.1 | 2.5 | 1.0 | 1.64 |
| CHB | | | 17.7 | 34.4 | -7.7 | -2.5 | -0.4 | 0 | -8.9 | -3.2 | 1.94 |
| 1MN | | | 22.1 | 38.3 | 7.7 | 2.5 | 1.4 | 0.7 | 6.7 | 1.7 | 1.73 |
| CHB/1MN | 30/70 | | 20.0 | 37.3 | 4.4 | 0.5 | 0.9 | 0.2 | 3.4 | 0.2 | 1.87 |
| CHB/1MN | 70/30 | | 18.3 | 35.7 | -2.8 | -0.4 | -0.4 | -0.2 | -4.4 | -1.1 | 1.95 |
| HB/CHB | 30/70 | | 16.0 | 33.2 | -11.2 | -3.6 | -1.3 | -0.3 | -11.5 | -4.0 | 2.08 |
| HB/CHB | 70/30 | | 14.5 | 31.4 | -14.1 | -4.2 | -1.5 | -0.4 | -14.4 | -4.4 | 2.16 |
| HB/1MN | 70/30 | | 15.1 | 32.5 | -14.2 | -3.9 | -1.4 | -0.2 | -14.7 | -4.5 | 2.15 |

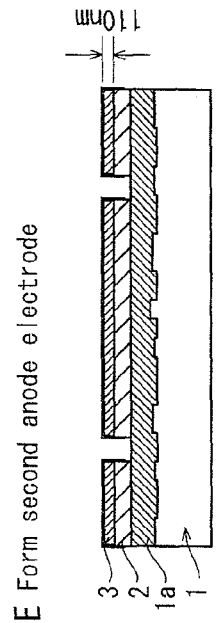
FIG. 22A Set substrate
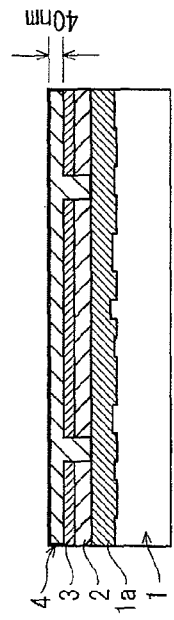
FIG. 22B Develop (remove protective resist)
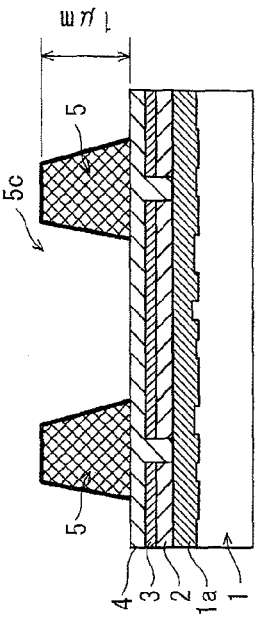
FIG. 22C Form planarizing film
FIG. 22D Form first anode electrode
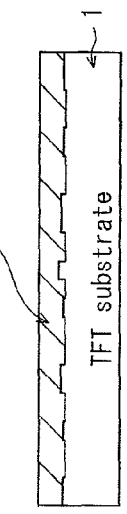
FIG. 22E Form second anode electrode
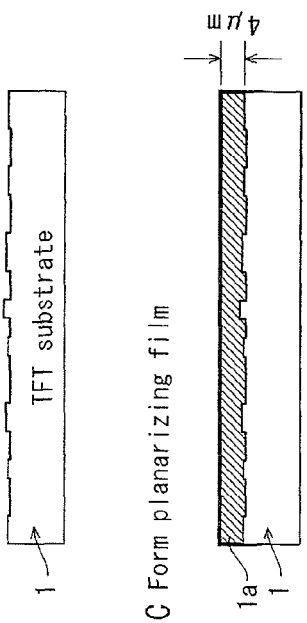
FIG. 22F Form hole injection layer
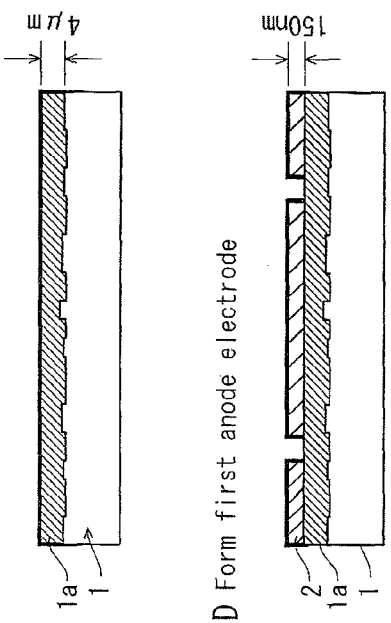
FIG. 22G Form banks

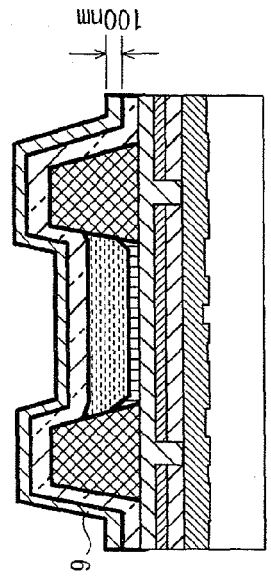
FIG. 23A Form hole transport layer
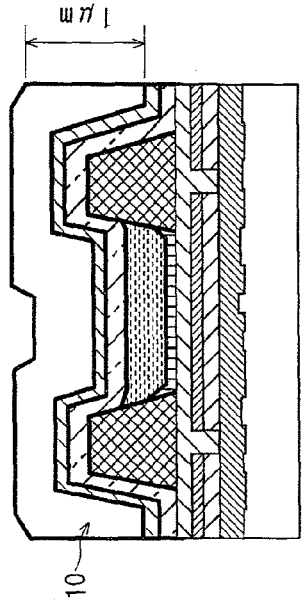
FIG. 23B Form light-emitting layer
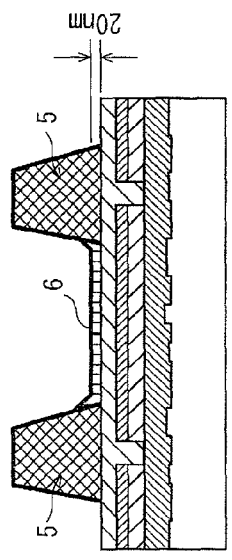
FIG. 23C Form electron transport layer
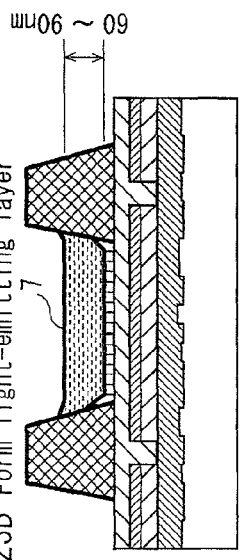
FIG. 23D Form cathode electrode
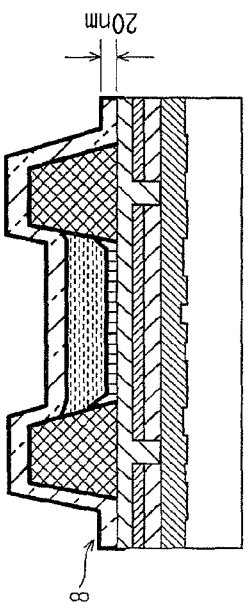
FIG. 23E Form sealing layer FIG. 26A
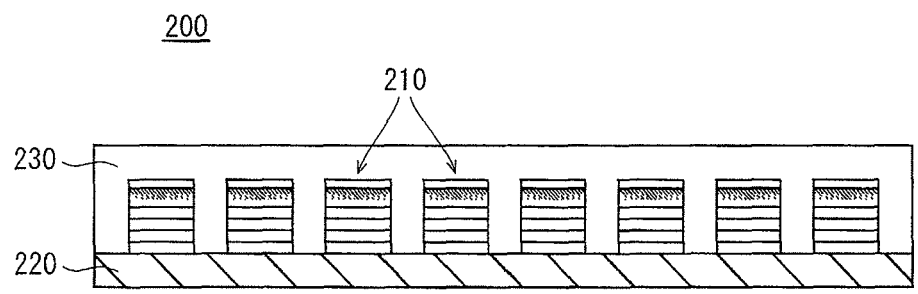
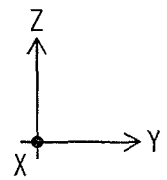
FIG. 26B
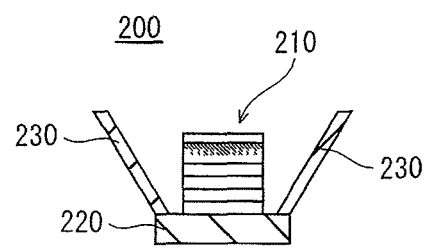
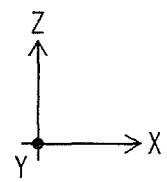

INK FOR ORGANIC LIGHT-EMITTING ELEMENT AND A METHOD FOR PRODUCING THE SAME

TECHNICAL FIELD

The present invention relates to an ink for an organic light-emitting element and a method for producing the ink.

BACKGROUND ART

Organic light-emitting elements, which have recently been being studied and developed, are light-emitters making use of an electric-field light-emitting phenomenon occurring in organic material and have a structure in which a light-emitting layer is interposed between an anode and a cathode.

Commonly, a light-emitting layer is partitioned for each organic light-emitting element by banks composed of insulating material, and a shape of the light-emitting layer is defined by such banks. In addition, between an anode and a light-emitting layer, a combination of a hole injection layer and a hole transport layer or a hole injection/transport layer is interposed as necessary, and between a cathode and a light-emitting layer, a combination of an electron injection layer and an electron transport layer or an electron injection/transport layer is interposed as necessary. Since the light-emitting layer, the hole injection layer, the hole transport layer, the hole injection/transport layer, the electron injection layer, the electron transport layer, and the electron injection/transport layer each achieve a corresponding function among functions such as the emission of light, the injection of electric charge, and the transportation of electric charge, such layers are collectively referred to as the "functional layer".

In an organic display device having a full-color display capability, such an organic light-emitting element corresponds to one sub-pixel, and further, a combination of three adjacent sub-pixels corresponding to the colors R, G, and B form one pixel. A plurality of such pixels are arranged in a matrix to form an image display region of an organic display device.

So as to enable such an organic display device to display high definition images, there is a demand for forming each pixel of an organic display device to have a microscopic size. In specific, it is demanded that each pixel be formed to have a length shorter than approximately 500 µm at each side thereof. In order to realize pixels having such a microscopic size, it is required that a functional layer in each organic light-emitting element be formed so as to have a small film thickness of tens to hundreds of nanometers.

The manufacture of an organic display device includes a step of forming a functional layer on a substrate. In the step of forming a functional layer, a wet process is often used in which an ink (an application solution) prepared by dissolving a functional material for forming the functional layer in a solvent is filled to between banks by an inkjet method (a droplet ejection method) or the like and then the filled ink is dried though a method of forming a film of low molecular material by the application of a vacuum process is also used. When the wet process is applied, a functional layer can be formed relatively easily even in a large panel.

CITATION LIST

Patent Literature

[Patent Literature 1]
Japanese Patent Application Publication No. 2007-069140

[Patent Literature 2]
Japanese Patent Application Publication No. H5-163488

[Patent Literature 3]
Japanese Patent Application Publication No. 2006-219663

SUMMARY OF INVENTION

Technical Problem

Light-emitting characteristics of an organic light-emitting element are greatly influenced by the film thickness of a functional layer included therein. For this reason, when a functional layer is formed by application of the above-described wet process, it is exemplary that the functional layer be formed so that the shape of the functional layer is planar by suppressing the occurrence of unevenness in film thickness of the functional layer. However, if a functional layer is formed by a process in which an ink is filled into areas in which elements are to be formed, the areas being located between banks on a substrate, and then the ink is dried as described above, it is likely that in each of the areas, the film thickness is greater at edges of area than at the center of the area, and therefore it is difficult to secure uniformity in film thickness. This is probably because when a solvent evaporates from an ink puddle filled between banks, drying of the ink progresses while the ink flows from the center toward the edges of the ink puddle because the solvent evaporates more easily at the edges than the center.

In view of this problem, Patent Literature 1, for example, discloses a technology for improving planarity of a functional layer by (i) using a mixed solvent (e.g. a mixed solvent composed of diethylene glycol and water) as the solvent in an ink for forming a functional layer, and (ii) stopping reduction of pressure, which is performed when drying an ink droplet film, at a saturation vapor pressure of one of the solvents composing the mixed solvent (i.e. water). This drying method can be expected to improve planarity of functional layers for pixels of a relatively large size. However, it is difficult to form a functional layer having a uniform film thickness and a planar shape by applying such a method when pixels having a microscopic size, where each side of the pixels has a length shorter than several hundred micrometers, are to be formed or when a functional layer having a film thickness of only tens to hundreds of nanometers is to be formed. In such cases, the solvents would completely vaporize before pressure is reduced from atmospheric pressure to the saturation vapor pressure of one of the solvents at which the reduction of pressure is to be stopped.

In view of such problems, an object of the present invention is to provide an ink for an organic light-emitting element and a method for producing the ink, the ink being capable of forming a functional layer having a high degree of planarity when forming a functional layer of an organic light-emitting element by the wet process.

Solution to Problem

For attaining the above-described object, the ink for an organic light-emitting element pertaining to one aspect of the present invention is characterized in that the ink comprises: a first solvent; a second solvent that differs from the first solvent; and a functional material that is soluble in the first solvent and the second solvent and that forms a functional layer of the organic light-emitting element, wherein the first solvent is a solvent such that when the second solvent is replaced with the first solvent and then a functional layer is formed imitatively, the imitatively formed functional layer has, in a light-emitting region of an organic light-emitting element, a shape such that the functional layer is thicker at both end portions than at a central portion and the top surfaces of the end portions are positioned higher than the top surface of the central portion, the second solvent is a solvent such that when the first solvent is replaced with the second solvent and then a functional layer is formed imitatively, the imitatively formed functional layer has, in a light-emitting region of an organic light-emitting element, a shape such that the functional layer is thicker at a central portion than at both end portions and the top surface of the central portion is positioned higher than the top surfaces of the end portions, and the boiling point of the first solvent is equal or similar to the boiling point of the second solvent.

Advantageous Effects of the Invention

In the ink pertaining to one aspect of the present invention are included the first solvent and the second solvent, the first solvent is a solvent such that, when the second solvent is replaced with the first solvent and then a functional layer is formed imitatively, the imitatively formed functional layer has a shape such that the functional layer is thicker at both end portions than at a central portion and the top surfaces of the end portions are positioned higher than the top surface of the central portion, the second solvent is a solvent that, when the first solvent in the ink is replaced with the second solvent and then a functional layer is formed imitatively, the imitatively formed functional layer has a shape such that the functional layer is thicker at a central portion than at both end portions and the top surface of the central portion is positioned higher than the top surfaces of the end portions. For this reason, the respective characteristics of the first solvent and the second solvent as described above, related to the shape of the functional layer, are neutralized. Hence, a functional layer is formed which is intermediate in shape between those formed by using the first solvent and the second solvent individually. In other words, a functional layer is formed which has a higher degree of planarity compared to those formed by using only one of the first solvent and the second solvent.

In addition, according to the above structure, the first solvent and the second solvent can be caused to evaporate at a similar timing since the first solvent and the second solvent have equal or similar boiling points. In contrast, when one of the solvents included in the ink has a considerably lower boiling point compared to the other solvent, the solvent having the lower boiling point evaporates more quickly compared to the other solvent. This brings about an increase in concentration of the ink, and thus, the functional layer is formed while the ink is in a state of high viscosity. In such a case, the composition of the ink at the point where the functional layer is formed is different from the initial composition of the ink. Thus, it is difficult to control the planarity of the functional layer. In view of this, the above structure suppresses the composition of the ink changing from the initial composition by causing the first solvent and the second solvent to evaporate at a similar timing. Hence, forming of a functional layer having a high degree of planarity can be realized while requiring only relatively easy control procedures to be carried out.

BRIEF DESCRIPTION OF DRAWINGS

FIGS. 2A and 2B illustrate a combination of implementation example 1.

FIGS. 4A and 4B illustrate a combination of comparative example 1.

FIG. 12 illustrates results of consideration carried out concerning an influence that a difference in boiling points between solvents has on shapes of functional layers.

FIG. 13 illustrates the Marangoni Number.

FIG. 14 illustrates a relation between a value $\gamma$ and a planarity degree PI.

FIG. 15 illustrates results of consideration carried out concerning a relation between a value $\gamma$ and a planarity degree PI.

FIG. 17 illustrates results of consideration carried out concerning an influence that film thicknesses of functional layers have on planarity degrees PI of the functional layers.

FIGS. 22A through 22G each illustrate a step in a method for manufacturing the organic light-emitting element pertaining to one aspect of the present invention.

FIGS. 23A through 23E each illustrate a step in a method for manufacturing the organic light-emitting element pertaining to one aspect of the present invention.

FIGS. 26A and 26B illustrate an organic light-emitting device pertaining to one aspect of the present invention.

DESCRIPTION OF EMBODIMENT

Figure 1A:
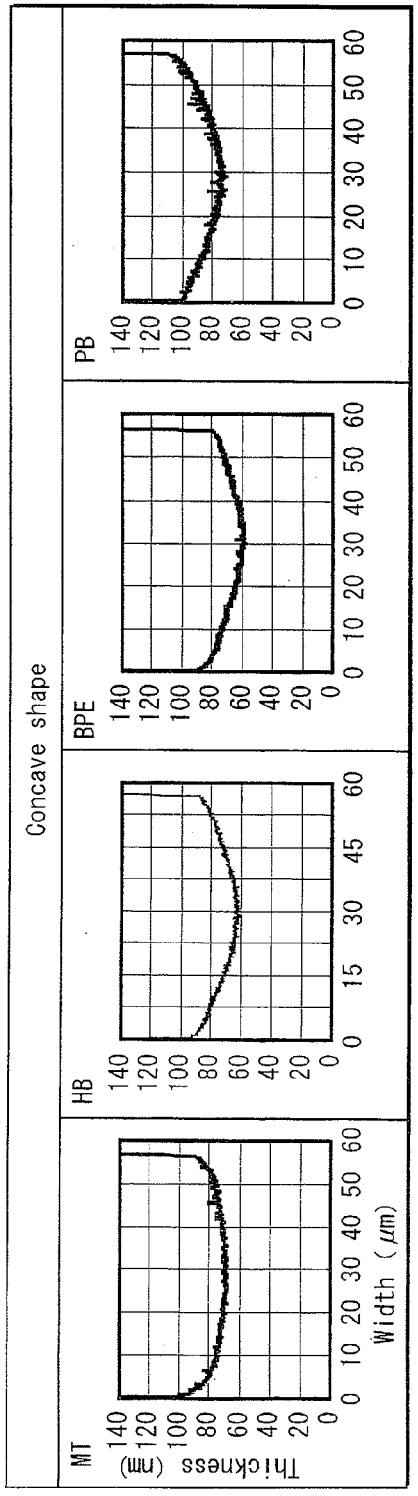
FIGS. 1A and 1B illustrate results of consideration carried out concerning shapes of functional layers formed by using single solvent-type inks.

In the following, explanation is provided of an ink for an organic light-emitting element, a method for producing the ink, a method for manufacturing an organic light-emitting element, an organic light-emitting element, an organic display device, an organic light-emitting device, a method for forming a functional layer, a functional member, a display device, and a light-emitting device, each of which pertaining to one aspect of the present invention, with reference to the accompanying drawings.

[Overview of Aspects of the Present Invention]

The ink for an organic light-emitting element pertaining to one aspect of the present invention is characterized in that the ink comprises: a first solvent; a second solvent that differs from the first solvent; and a functional material that is soluble in the first solvent and the second solvent and that forms a functional layer of the organic light-emitting element, wherein the first solvent is a solvent such that when the second solvent is replaced with the first solvent and then a functional layer is formed imitatively, the imitatively formed functional layer has, in a light-emitting region of an organic light-emitting element, a shape such that the functional layer is thicker at both end portions than at a central portion and the top surfaces of the end portions are positioned higher than the top surface of the central portion, the second solvent is a solvent such that when the first solvent is replaced with the second solvent and then a functional layer is formed imitatively, the imitatively formed functional layer has, in a light-emitting region of an organic light-emitting element, a shape such that the functional layer is thicker at a central portion than at both end portions and the top surface of the central portion is positioned higher than the top surfaces of the end portions, and the boiling point of the first solvent is equal or similar to the boiling point of the second solvent.

In the ink for an organic light-emitting element pertaining to one aspect of the present invention, the first solvent and the second solvent may be mixed in a mixing ratio such that the level of the top surface of the functional layer will become uniform throughout from the end portions to the central portion and the thickness of the functional layer will become uniform from the end portions to the central portion.

In the ink for an organic light-emitting element pertaining to one aspect of the present invention, the first solvent and the second solvent may be mixed according to a mixing ratio α/β, wherein in a light-emitting region of an organic light-emitting element, when the degree of planarity PI of the following [Equation 1] is expressed by the thickness $d_C$ of the functional layer at the central portion side and the thicknesses $d_L$, $d_R$ of the functional layer at one end portion side and the other end portion side:

$$PI = d_C - (d_L + d_R)/2 \quad \text{[Equation 1]}$$

where PI: the degree of planarity, $d_c$: the thickness at the central portion side, $d_L$: the thickness at one end portion side, and $d_R$: the thickness at the other end portion side, the mixing ratio is expressed by α, which is the reciprocal of the absolute value of a degree of planarity $PI_1$, and β, which is the reciprocal of the absolute value of a degree of planarity $PI_2$, in the following [Equation 2]:

$$\alpha \times PI_1 = \beta \times PI_2 \quad \text{[Equation 2]}$$

where $PI_1$: the degree of planarity of a functional layer imitatively formed with replacement of the second solvent with the first solvent, α: the reciprocal of the absolute value of the degree of planarity $PI_1$, $PI_2$: the degree of planarity of a functional layer imitatively formed with replacement of the first solvent with the second solvent, and β: the reciprocal of the absolute value of the degree of planarity $PI_2$.

In the ink for an organic light-emitting element pertaining to one aspect of the present invention, the first solvent and the second solvent may be present each in an amount within ±15 vol % of their individual volumetric concentration determined according to the mixing ratio α/β.

In the ink for an organic light-emitting element pertaining to one aspect of the present invention, the difference in boiling point between the first solvent and the second solvent may be equal to or smaller than 9° C.

In the ink for an organic light-emitting element pertaining to one aspect of the present invention, the boiling point of the second solvent may be higher than the boiling point of the first solvent.

In the ink for an organic light-emitting element pertaining to one aspect of the present invention, when the ratio (σ/η) of the surface tension σ (mN·m$^{-1}$) of an ink to the viscosity η (mPa·s) of the ink is γ, the ink imitatively prepared by replacing the second solvent with the first solvent may satisfy γ>1.9, and the ink imitatively prepared by replacing the first solvent with the second solvent may satisfy γ<1.9.

In the ink for an organic light-emitting element pertaining to one aspect of the present invention, each of the end portions of the functional layer may be an area of the light-emitting region corresponding to a distance of 12.5% of the entire length of the light-emitting region from a corresponding end of the light-emitting region towards the center of the light-emitting region, and the central portion of the functional layer may be an area corresponding to the center of the light-emitting region.

In the ink for an organic light-emitting element pertaining to one aspect of the present invention, the functional layer may have a rectangular shape in plan view, and the light-emitting region may correspond to the short side direction of the functional layer.

In the ink for an organic light-emitting element pertaining to one aspect of the present invention, the first solvent may be cyclohexylbenzene, the second solvent may be 1-methylnaphthalene, and the functional material may be F8-F6. In the ink for an organic light-emitting element pertaining to one aspect of the present invention, the mixing ratio α/β of the first solvent and the second solvent may be within a range of 28/72 to 72/28.

In the ink for an organic light-emitting element pertaining to one aspect of the present invention, the first solvent may be heptylbenzene, the second solvent may be 1-methylnaphthalene, and the functional material may be F8-F6. In the ink for an organic light-emitting element pertaining to one aspect of the present invention, the mixing ratio α/β of the first solvent and the second solvent may be within a range of 5/95 to 38/62.

In the ink for an organic light-emitting element pertaining to one aspect of the present invention, the functional material may be an organic light-emitting material.

The ink for an organic light-emitting element pertaining to one aspect of the present invention comprises: a first solvent; a second solvent that differs from the first solvent; and a functional material that is soluble in the first solvent and the second solvent and that forms a functional layer of the organic light-emitting element, wherein the first solvent is a solvent such that when used alone, a functional layer to be formed between banks has a shape such that the functional layer is thicker at both end portions than at a central portion and the top surfaces of the end portions are positioned higher than the top surface of the central portion, the second solvent is a solvent such that when used alone, a functional layer to be formed between banks has a shape such that the functional layer is thicker at a central portion than at both end portions and the top surface of the central portion is positioned higher than the top surfaces of the end portions, and the boiling point of the first solvent is equal or similar to the boiling point of the second solvent.

The ink for an organic light-emitting element pertaining to one aspect of the present invention comprises: a first solvent; a second solvent that differs from the first solvent; and a functional material that is soluble in the first solvent and the second solvent and that forms a functional layer of the organic light-emitting element, wherein when the ratio ($\sigma/\eta$) of the surface tension $\sigma$ (mN·m$^{-1}$) of the ink to the viscosity $\eta$ (mPa·s) of the ink is $\gamma$, an ink imitatively prepared by replacing the second solvent with the first solvent satisfies $\gamma>1.9$, an ink imitatively prepared by replacing the first solvent with the second solvent satisfies $\gamma<1.9$, and the difference in boiling point between the first solvent and the second solvent is equal to or smaller than 9° C.

In the ink for an organic light-emitting element pertaining to one aspect of the present invention, the functional material, the first solvent, and the second solvent may be mixed so that $\gamma$ satisfies $\gamma=1.9$ when the functional material, the first solvent, and the second solvent are mixed.

In the ink for an organic light-emitting element pertaining to one aspect of the present invention, the first solvent and the second solvent may be mixed in a mixing ratio such that the level of the top surface of the functional layer will become uniform throughout from the end portions to the central portion and the thickness of the functional layer will become uniform from the end portions to the central portion.

In the ink for an organic light-emitting element pertaining to one aspect of the present invention, the first solvent and the second solvent may be mixed according to a mixing ratio $\alpha/\beta$, wherein in a light-emitting region of an organic light-emitting element, when the degree of planarity PI of the above-described [Equation 1] is expressed by the thickness $d_C$ of the functional layer at the central portion side and the thicknesses $d_L$, $d_R$ of the functional layer at one end portion side and the other end portion side, the mixing ratio is expressed by $\alpha$, which is the reciprocal of the absolute value of a degree of planarity $PI_1$, and $\beta$, which is the reciprocal of the absolute value of a degree of planarity $PI_2$, in the above-described [Equation 2].

In the ink for an organic light-emitting element pertaining to one aspect of the present invention, the first solvent and the second solvent may be present each in an amount within ±15 vol % of their individual volumetric concentration determined according to the mixing ratio $\alpha/\beta$.

In the ink for an organic light-emitting element pertaining to one aspect of the present invention, the boiling point of the second solvent is higher than the boiling point of the first solvent.

In the ink for an organic light-emitting element pertaining to one aspect of the present invention, each of the end portions of the functional layer is an area of the light-emitting region corresponding to a distance of 12.5% of the entire length of the light-emitting region from a corresponding end of the light-emitting region towards the center of the light-emitting region, and the central portion of the functional layer is an area corresponding to the center of the light-emitting region.

In the ink for an organic light-emitting element pertaining to one aspect of the present invention, the functional layer may have a rectangular shape in plan view, and the light-emitting region may correspond to the short side direction of the functional layer.

In the ink for an organic light-emitting element pertaining to one aspect of the present invention, the first solvent may be cyclohexylbenzene, the second solvent may be 1-methylnaphthalene, and the functional material may be F8-F6.

In the ink for an organic light-emitting element pertaining to one aspect of the present invention, the mixing ratio $\alpha/\beta$ of the first solvent and the second solvent may be within a range of 28/72 to 78/22. In the ink for an organic light-emitting element pertaining to one aspect of the present invention, the first solvent may be heptylbenzene, the second solvent may be 1-methylnaphthalene, and the functional material may be F8-F6. In the ink for an organic light-emitting element pertaining to one aspect of the present invention, the mixing ratio $\alpha/\beta$ of the first solvent and the second solvent may be within a range of 5/95 to 38/62.

In the ink for an organic light-emitting element pertaining to one aspect of the present invention, the functional material may be an organic light-emitting material.

The ink for an organic light-emitting element pertaining to one aspect of the present invention comprises: a first solvent; a second solvent that differs from the first solvent; and a functional material that is soluble in the first solvent and the second solvent and that forms a functional layer of the organic light-emitting element, wherein when the ratio ($\sigma/\eta$) of the surface tension $\sigma$ (mN·m$^{-1}$) of an ink of the time when used alone as a solvent of the functional material to the viscosity $\eta$ (mPa·s) of the ink is $\gamma$, the ink imitatively prepared by replacing the second solvent with the first solvent satisfies $\gamma>1.9$, the ink imitatively prepared by replacing the first solvent with the second solvent satisfies $\gamma<1.9$, and the difference in boiling point between the first solvent and the second solvent is equal to or smaller than 9° C.

The method for producing an ink for an organic light-emitting element pertaining to one aspect of the present invention is a method for producing an ink for an organic light-emitting element, the ink including a first solvent, a second solvent that differs from the first solvent, and a functional material that is soluble in the first solvent and the second solvent and that forms a functional layer of the organic light-emitting element, the method comprising: a first step of preparing the first solvent, the second solvent, and the functional material; and a second step of mixing the first solvent, the second solvent, and the functional material, wherein the first solvent is a solvent such that when the second solvent is replaced with the first solvent and then a functional layer is formed imitatively, the imitatively formed functional layer has, in a light-emitting region of an organic light-emitting element, a shape such that the functional layer is thicker at both end portions than at a central portion and the top surfaces of the end portions are positioned higher than the top surface of the central portion, the second solvent is a solvent such that when the first solvent is replaced with the second solvent and then a functional layer is formed imitatively, the imitatively formed functional layer has, in a light-emitting region of an organic light-emitting element, a shape such that the functional layer is thicker at a central portion than at both end portions and the top surface of the central portion is positioned higher than the top surfaces of the end portions, and the boiling point thereof is equal or similar to the boiling point of the first solvent.

The method for producing an ink for an organic light-emitting element pertaining to one aspect of the present invention is a method for producing an ink for an organic light-emitting element, the ink including a first solvent, a second solvent that differs from the first solvent, and a functional material that is soluble in the first solvent and the second solvent and that forms a functional layer of the organic light-emitting element, the manufacturing method comprising: a first step of preparing the first solvent, the second solvent, and the functional material; and a second step of mixing the first solvent, the second solvent, and the functional material, wherein when the ratio ($\sigma/\eta$) of the surface tension $\sigma$ (mN·m$^{-1}$) of the ink to the viscosity $\eta$ (mPa·s) of the ink is $\gamma$, the first solvent is a solvent such that an ink imitatively prepared by replacing the second solvent with the first solvent satisfies $\gamma > 1.9$, the second solvent is a solvent such that an ink imitatively prepared by replacing the first solvent with the second solvent satisfies $\gamma < 1.9$ and the boiling point of the solvent has a difference of 9° C. or less from the boiling point of the first solvent.

[Ink for Organic Light-Emitting Element]

An ink for an organic light-emitting element (referred to hereinafter simply as "ink") pertaining to one aspect of the present invention includes at least a functional material, a first solvent, and a second solvent. The boiling point of the first solvent is equal to or similar to the boiling point of the second solvent.

[Functional Material]

The functional material is a material that forms a functional layer of an organic light-emitting element, and is, for example, an organic light-emitting material. One exemplary example of the organic light-emitting material is F8-F6 (a copolymer of F8 (polydioctylfluorene) and F6 (polydihexylfluorene).

In addition, such materials as provided in the following may be used as the functional material instead of F8-F6. Such materials include: a fluorene compound other than F8-F6 such as F8 and F6; an oxinoid compound; perylene compound; coumarin compound; azacoumarin compound; oxazole compound; oxadiazole compound; perinone compound; pyrrolo-pyrrole compound; naphthalene compound; anthracene compound; fluoranthene compound; tetracene compound; pyrene compound; coronene compound; quinolone compound and azaquinolone compound; pyrazoline derivative and pyrazolone derivative; rhodamine compound; chrysene compound; phenanthrene compound; cyclopentadiene compound; stilbene compound; diphenylquinone compound; styryl compound; butadiene compound; dicyanomethylene pyran compound; dicyanomethylene thiopyran compound; fluorescein compound; pyrylium compound; thiapyrylium compound; selenapyrylium compound; telluropyrylium compound; aromatic aldadiene compound; oligophenylene compound; thioxanthene compound; anthracene compound; cyanine compound; acridine compound; metal complex of an 8-hydroxyquinoline compound; metal complex of a 2-bipyridine compound; complex of a Schiff base and a group three metal; metal complex of oxine; rare earth metal complex, etc (refer to Patent Literature 2). Note that such compounds and complexes may be used either independently or in combination by mixing a plurality of such compounds and complexes.

In addition, the functional material is completely soluble in each of the first solvent and the second solvent.

[First Solvent]

The first solvent is a solvent such that, when the second solvent in the ink is replaced with the first solvent and then a functional layer is formed imitatively, the imitatively formed functional layer has, in a light-emitting region of organic light-emitting element, a shape such that the functional layer is thicker at both end portions than at a central portion and the top surfaces of the end portions are positioned higher than the top surface of the central portion. Alternatively, the first solvent may be a solvent such that, when the second solvent is replaced with the first solvent and then a functional layer is formed imitatively, the imitatively formed functional layer has a shape such that the top surfaces of the end portions protrude higher than the top surface of the central portion. Alternatively, the first solvent may be a solvent such that when used alone, a functional layer to be formed between banks has a shape such that the functional layer is thicker at both end portions than at a central portion and the top surfaces of the end portions are positioned higher than the top surface of the central portion.

One example of a specific shape of an imitatively formed functional layer that is to be formed when the second solvent in the ink is replaced with the first solvent is a concave shape. Here, the term "concave shape" refers to, for example, a shape exhibited by a functional layer having a concave top surface and a planar bottom surface. However, the shape indicated by the term "concave shape" is not limited to this. For example, a functional layer having a "convex shape" need not have a planar bottom surface, and instead, the functional layer having a "convex shape" may have a concave or convex bottom surface, or may have an uneven bottom surface with concavities and convexities. However, in any case, it is exemplary that a functional layer having a "concave shape" have a concave top surface.

The term "end portions" may refer to given locations in the vicinity of respective ends of a functional layer, and the term "central portion" may refer to a given location in the vicinity of a center of a functional layer. Thus, the indication that the functional layer is thicker at both end portions than at a central portion indicates that the film thickness of the functional layer at given locations in the vicinity of respective ends of the functional layer is greater than the film thickness of the functional layer at a given location in the vicinity of a center of the functional layer. Hence, such an indication does not necessarily indicate a state of a functional layer where the film thickness of the functional layer gradually increases as approaching respective ends of the functional layer from a center of the functional layer. Accordingly, a functional layer having a "concave shape" does not necessarily exhibit a concave shape where the height of a top surface of the functional layer is smallest at a center of the functional layer. Instead, a functional layer having a "concave shape" may exhibit a concave shape where the height of a top surface of the functional layer is smallest at a middle point between a center of the functional layer and one end of the functional layer. Further, a functional layer having a "concave shape" does not necessarily exhibit a concave shape where the height of a top surface of the functional layer gradually decreases as approaching a center of the functional layer from respective ends of the functional layer. Instead, a functional layer having a "concave shape" may exhibit a concave shape where local increases exist in the height of a top surface of the functional layer at middle points between a center of the functional layer and respective ends of the functional layer. That is, the height of a top surface of a functional layer having a "concave shape" need not gradually decrease as approaching a center of the functional layer from respective ends of the functional layer, and a certain level of unevenness may exist on the top surface of the functional layer.

Specific examples of solvents which may be used as the first solvent include: cyclohexylbenzene (CHB); heptylbenzene (HB); methoxytoluene (MT); butyl phenyl ether (BPE); and pentylbenzene (PB). However, solvents which may be used as the first solvent are not limited to those solvents presented above, and other solvents may also be used.

In addition, it is exemplary that, when the ratio ($\sigma/\eta$) of a surface tension $\sigma$ (mN·m$^{-1}$) of an ink to a viscosity $\eta$ (mPa·s) of the ink is $\gamma$, an ink imitatively prepared by replacing the second solvent with the first solvent satisfy $\gamma > 1.9$. Detailed explanation concerning the value $\gamma$ is provided in the following.

[Second Solvent]

The second solvent is a solvent such that when the first solvent is replaced with the second solvent and then a functional layer is formed imitatively, the imitatively formed functional layer has, in a light-emitting region of an organic light-emitting element, a shape such that the functional layer is thicker at a central portion than at both end portions and the top surface of the central portion is positioned higher than the top surfaces of the end portions. Alternatively, the second solvent may be a solvent such that, when the first solvent is replaced with the second solvent and then a functional layer is formed imitatively, the imitatively foi Hied functional layer has a shape such that the top surface of the central portion protrudes higher than the top surfaces of the end portions. Alternatively, the second solvent may be a solvent such that when used alone, a functional layer to be formed between banks has a shape such that the functional layer is thicker at a central portion than at both end portions and the top surface of the central portion is positioned higher than the top surfaces of the end portions.

One example of a specific shape of an imitatively formed functional layer that is to be formed when the first solvent in the ink is replaced with the second solvent is a convex shape. Here, the term "convex shape" refers to, for example, a shape exhibited by a functional layer having a convex top surface and a planar bottom surface. However, the shape indicated by the term "convex shape" is not limited to this. For example, a functional layer having a "convex shape" need not have a planar bottom surface, and instead, the functional layer having a "convex shape" may have a concave or convex bottom surface, or may have an uneven bottom surface with concavities and convexities. However, in any case, it is exemplary that a functional layer having a "convex shape" have a convex top surface.

The locations of a functional layer indicated by the terms "end portions" and "central portion" are as explained above. Thus, the indication that the functional layer is thicker at a central portion than at both end portions indicates that the film thickness of a functional layer at a given location in the vicinity of a center of the functional layer is greater than the film thickness of the functional layer at given locations in the vicinity of respective ends of the functional layer. Hence, such an indication does not necessarily indicate a state of a functional layer where the film thickness of the functional layer gradually increases as approaching a center of the functional layer from respective ends of the functional layer. Accordingly, a functional layer having a "convex shape" does not necessarily exhibit a convex shape where the height of a top surface of the functional layer is greatest at a center of the functional layer. Instead, a functional layer having a "convex shape" may exhibit a convex shape where the height of a top surface of the functional layer is greatest at a middle point between a center of the functional layer and one end of the functional layer. Further, a functional layer having a "convex shape" does not necessarily exhibit a convex shape where the height of a top surface of the functional layer gradually increases as approaching a center of the functional layer from respective ends of the functional layer. Instead, a functional layer having a "convex shape" may exhibit a convex shape where local decreases exist in the height of a top surface of the functional layer at middle points between a center of the functional layer and respective ends of the functional layer. That is, the height of a top surface of a functional layer having a "convex shape" need not gradually increase as approaching a center of functional layer from respective ends of the functional layer, and a certain level of unevenness may exist on a top surface of the functional layer.

Specific examples of solvents which may be used as the second solvent include: 1-methylnaphthalene (1MN); nonylbenzene (NB); and 1-ethylnaphthalene. However, solvents which may be used as the second solvent are not limited to those solvents presented above, and other solvents may also be used.

In addition, it is exemplary that, an ink imitatively prepared by replacing the first solvent with the second solvent satisfy γ<1.9. Detailed explanation concerning the value γ is provided in the following.

[Experimentation and Consideration]

[Shapes of Functional Layers Formed with Single Solvent-Type Inks]

Figure 1B:
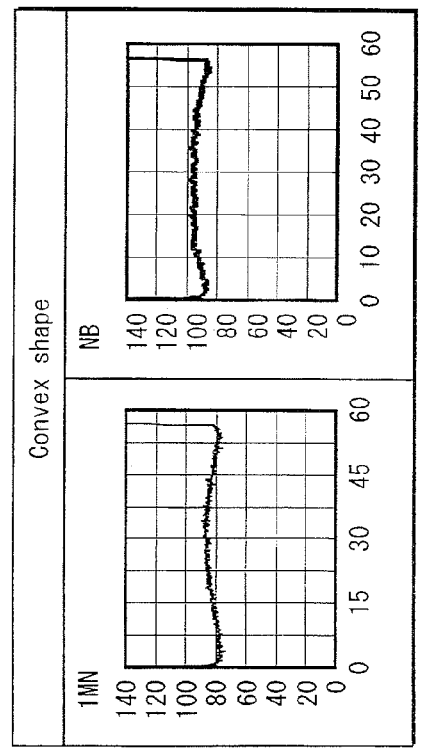

FIGS. 1A and 1B illustrate results of consideration carried out concerning the shapes of functional layers formed by using single solvent-type inks. In the experiments, various single solvent-type inks were prepared by dissolving the functional material in various solvents, and the shapes of the functional layers formed by using the various single-solvent type inks were observed.

In the experiments, F8-F6 was used as the functional material, and the single solvent-type inks were each prepared so as to have a concentration of 1.2 wt %. Further, by using each of the single solvent-type inks, functional layers were formed so as to have rectangular shapes in plan view and further, so as to form lines in plan view. More specifically, for each of the single solvent-type inks, a functional layer was formed so as to have a short side length of 60 μm and so as to have an average film thickness (an average film thickness between two ends of a functional layer in the short side direction) of 80 nm. The graphs in FIGS. 1A and 1B each indicate the shape of a functional layer formed by using a corresponding single solvent-type ink. In the graphs, the X axis indicates the short side length of a functional layer, and the Y axis indicates the film thickness of a functional layer. Note that unless otherwise indicated, functional layers are formed according to the above-described conditions in other experiments to be described in the following as well.

As illustrated in FIG. 1A, the functional layers formed by using MT, HB, BPE, and PB each exhibited a concave shape. In contrast, as illustrated in FIG. 1B, the functional layers formed by using 1 MN and NB each exhibited a convex shape. Further, the concave shapes of the functional layers formed by using MT, HB, BPE, and PB and the convex shapes of the functional layers formed by using 1 MN and NB, which are illustrated in FIGS. 1A and 1B, were maintained regardless of time elapsing since the forming of the functional layers.

The above-described experiments revealed that functional layers having convex shapes, in addition to functional layers having concave shapes, can be yielded by using different solvents, which conformed to the predictions made by the inventors prior to the experiments. Further, based on the results of the experiments, the inventors arrived at the conception that a functional layer having a high degree of planarity can be yielded by forming a functional layer by using an ink including an appropriate combination of (i) one solvent having a characteristic of forming a functional layer having a concave shape (referred to hereinafter as a "solvent having a concavity-forming characteristic") and (ii) another solvent having a characteristic of forming a functional layer having a convex shape (referred to hereinafter as a "solvent having a convexity-forming characteristic") since the concave-forming characteristic of one solvent and the convexity-forming characteristic of the other solvent would neutralize each other in the ink. Note that a solvent may exist, which forms a functional layer having a concave shape when a concentration of the functional material is lower than commonly included in an ink but forms a functional layer having a convex shape when a concentration of the functional material is higher than commonly included in an ink. However, such a case is not taken into consideration here, and the concavity-forming characteristics and the convexity-forming characteristics as referred to herein are those exhibited by solvents in inks including an appropriate concentration of the functional material, which can be actually prepared.

[Combination of Solvents]

The inventors investigated an exemplary combination of solvents by preparing various solvent mixture-type inks. In the following, two examples, in each of which a combination of a solvent having a concavity-forming characteristic and a solvent having a convexity-forming characteristic yielded a functional layer having a high degree of planarity, are described as implementation examples 1 and 2. In addition, an example, in which a combination of two types of solvents both having concavity-forming characteristics did not yield a functional layer having a high degree of planarity, is described as comparative example 1. Further, an example, in which, although a solvent having a concavity-forming characteristic and a solvent having a convexity-forming characteristic were used in combination, a functional layer having a high degree of planarity was not yielded, is described as comparative example 2.

FIG. 2 illustrates the combination in implementation example 1. A functional layer formed by using a single solvent-type ink including CHB (CHB corresponds to the first solvent) exhibited a concave shape, as illustrated in portion (a) of FIG. 2. On the other hand, a functional layer formed by using a single solvent-type ink including 1MN (1MN corresponds to the second solvent) exhibited a convex shape, as illustrated in portion (a) of FIG. 2. Further, a functional layer formed by using a solvent mixture-type ink including CHB and 1 MN exhibited a higher degree of planarity than the functional layer formed by using the single solvent-type ink including CHB and the functional layer formed by using the single solvent-type ink including 1MN, as illustrated in portion (b) of FIG. 2. In addition, by mixing CHB and 1MN at a predetermined mixing ratio (CHB/1MN=70/30), a functional layer having excellent planarity was yielded.

Figures 3A, 3B:
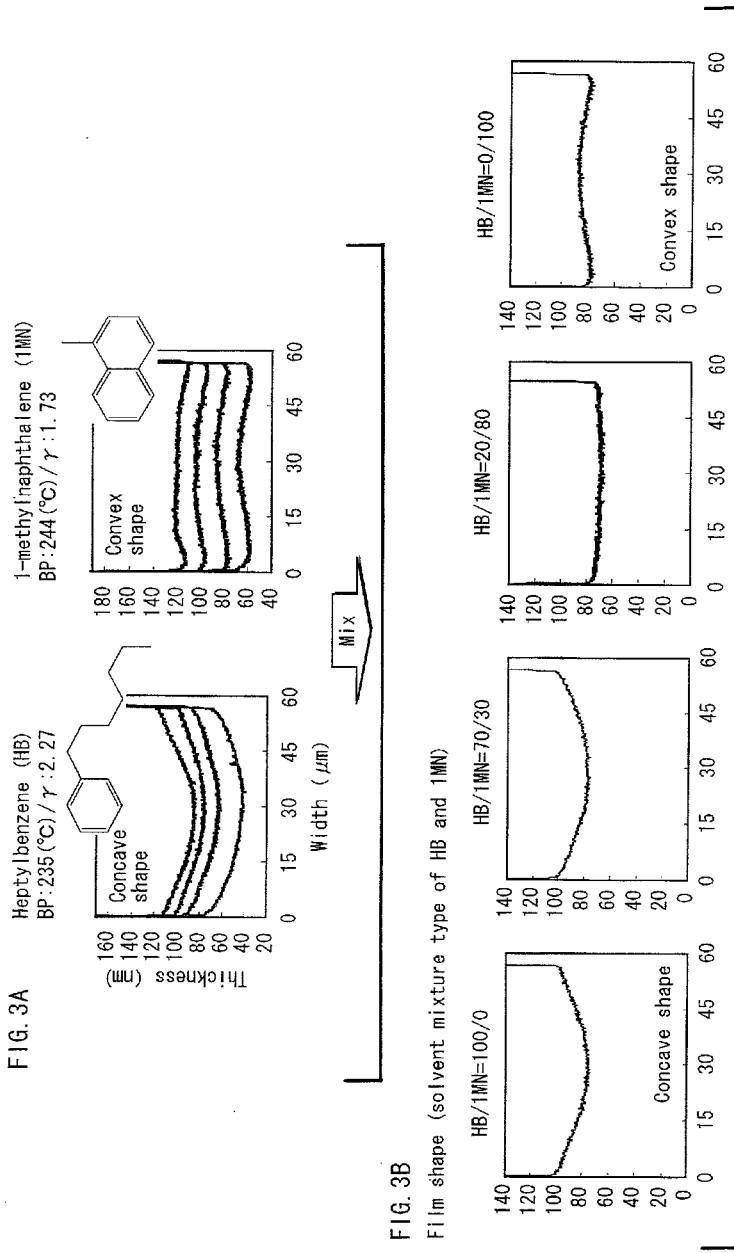
FIGS. 3A and 3B illustrate a combination of implementation example 2.

FIG. 3 illustrates the combination in implementation example 2. A functional layer formed by using a single solvent-type ink including HB (HB corresponds to the first solvent) exhibited a concave shape, as illustrated in portion (a) of FIG. 3. The shape of the functional layer formed by using the single solvent-type ink including 1 MN was as described above. A functional layer formed by using a solvent mixture-type ink including HB and 1 MN exhibited a higher degree of planarity than the functional layer formed by using the single solvent-type ink including HB and the functional layer formed by using the single solvent-type ink including 1MN, as illustrated in portion (b) of FIG. 3. In addition, by mixing HB and 1MN at a predetermined mixing ratio (HB/1MN=20/80), a functional layer having excellent planarity was yielded.

FIG. 4 illustrates the combination in comparative example 1. A functional layer formed by using a single solvent-type ink including PB (PB corresponds to the first solvent) exhibited a concave shape, as illustrated in portion (a) of FIG. 4. The shape of the functional layer formed by using the single solvent-type ink including 1MN was as described above. Although the solvent mixture-type ink prepared by using PB and 1MN included a combination of a solvent having a concavity-forming characteristic and a solvent having a convexity-forming characteristic, the functional layer yielded by using the solvent mixture-type ink including PB and 1MN exhibited an unexpectedly low degree of planarity, as illustrated in portion (b) of FIG. 4. In fact, the functional layer formed by using the solvent mixture-type ink including PB and 1MN exhibited a higher degree of convexity than the functional layer formed by using the single solvent-type ink including 1 MN.

Figures 5A, 5B:
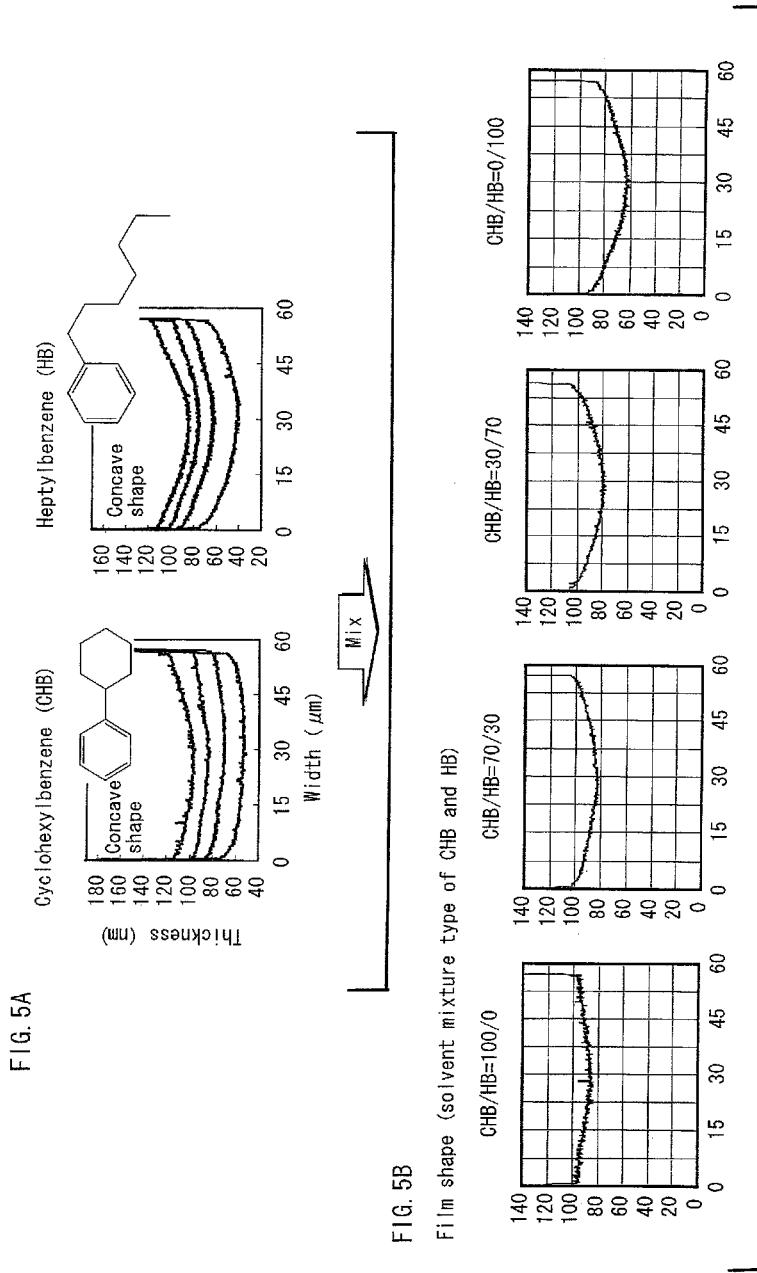
FIGS. 5A and 5B illustrate a combination of comparative example 2.

FIG. 5 illustrates the combination in comparative example 2. The shapes of the functional layers formed by using the single solvent-type ink including CHB and the single solvent-type ink including HB were as described above and as illustrated in portion (a) of FIG. 5. Since the solvent mixture-type ink formed by using CHB and HB included a combination of two solvents both having concavity-forming characteristics, the functional layer formed by using the solvent mixture-type ink exhibited a concave shape, as illustrated in portion (b) of FIG. 5. Further, the functional layer formed by using the solvent mixture-type ink including the combination of CHB and HB exhibited a concave shape regardless of the mixing ratio at which the two solvents were mixed. Similarly, the functional layer formed by using the solvent mixture-type ink including the combination of CHB and HB did not exhibit improved planarity, and the functional layer formed by using the solvent mixture-type ink including CHB and HB consistently exhibited a lower or equal degree of planarity compared to the functional layer formed by using the single solvent-type ink including HB.

The results of the experiments, which are indicated in FIGS. 2 through 5, revealed the following. First, the results of implementation examples 1 and 2 revealed that a combination of a solvent having a concavity-forming characteristic and a solvent having a convexity-forming characteristic yields a functional layer having a high degree of planarity and that, by mixing such solvents at an exemplary mixing ratio, a functional layer having excellent planarity can be yielded. However, the results of comparative example 1 revealed that merely combining a solvent having a concavity-forming characteristic and a solvent having a convexity-forming characteristic does not guarantee that a functional layer having a high degree of planarity is yielded. This is since there were cases where a combination of a solvent having a concavity-forming characteristic and a solvent having a convexity-forming characteristic did not yield a functional layer having an improved degree of planarity. In addition, the results of comparative example 2 revealed that a combination of two solvents both having the same characteristics does not yield a functional layer having an improved degree of planarity. This is since the combination of two solvents both having concavity-forming characteristics only resulted in a functional layer having a concave shape being yielded.

Figure 6:
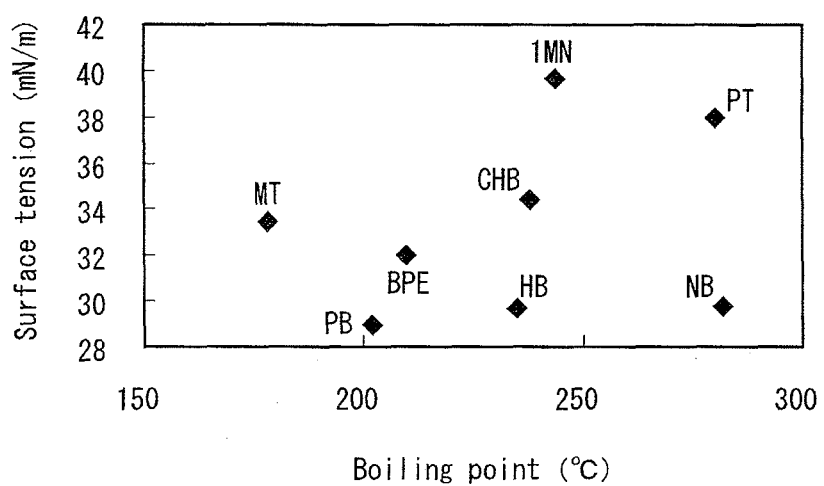
FIG. 6 illustrates surface tensions and boiling points of solvents.

FIG. 6 illustrates surface tensions and boiling points of various solvents. The solvents CHB and 1MN, which were used in implementation example 1, have equal or similar boiling points, and similarly, the solvents HB and 1 MN, which were used in implementation example 2, have equal or similar boiling points, as illustrated in FIG. 6. In contrast, the solvents PB and 1MN, which were used in comparative example 1, have considerably different boiling points. Based on this, the inventors arrived at an assumption that the boiling points of the solvents used in the experiments may account for the different outcome obtained from cases where combinations of a solvent having a concavity-forming characteristic and a solvent having a convexity-forming characteristic were similarly used. That is, the inventors considered that the degree of improvement in the planarity of a functional layer formed by using a combination of a solvent having a concavity-forming characteristic and a solvent having a convexity-forming characteristic may be influenced by the boiling points of the solvents combined. As such, the inventors arrived at the conception that, in order so as to yield a functional layer having a high degree of planarity, it is necessary not only to use a combination of a solvent having a concavity-forming characteristic and a solvent having a convexity-forming characteristic but also to ensure that the solvents to be combined have equal or similar boiling points. Further, by carrying out consideration by actually mixing solvents having equal or similar boiling points, the inventors found that, when solvents having equal or similar boiling points are mixed to form a solvent mixture-type ink, the shape of the functional layer yielded changes in accordance with the mixing ratio at which such solvents are mixed.

That is, the inventors arrived at the conception that a planar functional layer can be yielded by (i) using a combination of a solvent having a concavity-forming characteristic and a solvent having a convexity-forming characteristic and thereby neutralizing the characteristics of the solvents in the solvent mixture-type ink and (ii) using a combination of solvents having equal or similar boiling points and thereby causing the solvents to evaporate from the solvent mixture-type ink at a similar timing. By forming a functional layer by using a solvent mixture-type ink including a combination of solvents fulfilling the above-described conditions, a functional layer having a high degree of planarity can be yielded since a ratio between the solvents in the solvent mixture-type ink can be maintained at a predetermined ratio while the solvents evaporate, which further results in the characteristics of the solvents being neutralized until the evaporation of the solvents is completed.

[Evaluation by Planarity Degree PI]

So as to obtain an ink that forms a functional layer having an even higher degree of planarity, the inventors investigated a method for performing a more precise evaluation of the planarity of functional layers. Accordingly, the inventors decided to evaluate a degree of planarity of a functional layer according to the difference in film thickness of the functional layer at different portions thereof, namely, at a central portion of the functional layer and at end portions of the functional layer. In specific, the inventors decided to evaluate a degree of planarity of a functional layer by applying a planarity degree PI. The planarity degree PI, which indicates a degree of planarity of a functional layer, is calculated by subtracting, from a value indicating the film thickness at a central portion of the functional layer, a value which is an average of values each indicating the film thickness of the functional layer at one of left and right end portions of the functional layer.

As indicated in [Equation 1] above, a planarity degree PI of a functional layer is indicated by using $d_c$, which indicates the film thickness of the functional layer at a central portion of the functional layer within a light-emitting region of an organic light-emitting element including the functional layer, and $d_L$ and $d_r$, which respectively indicate the film thickness of the functional layer at one end portion of the functional layer within the light-emitting region and the film thickness of the functional layer at the other end portion within the light-emitting region. A negative value of a planarity degree PI indicates that a corresponding functional layer has a concave shape, whereas a positive value of a planarity degree PI indicates that a corresponding functional layer has a convex shape. Further, an absolute value of a planarity degree PI indicates a degree of concavity/convexity of a corresponding functional layer.

Figure 7:
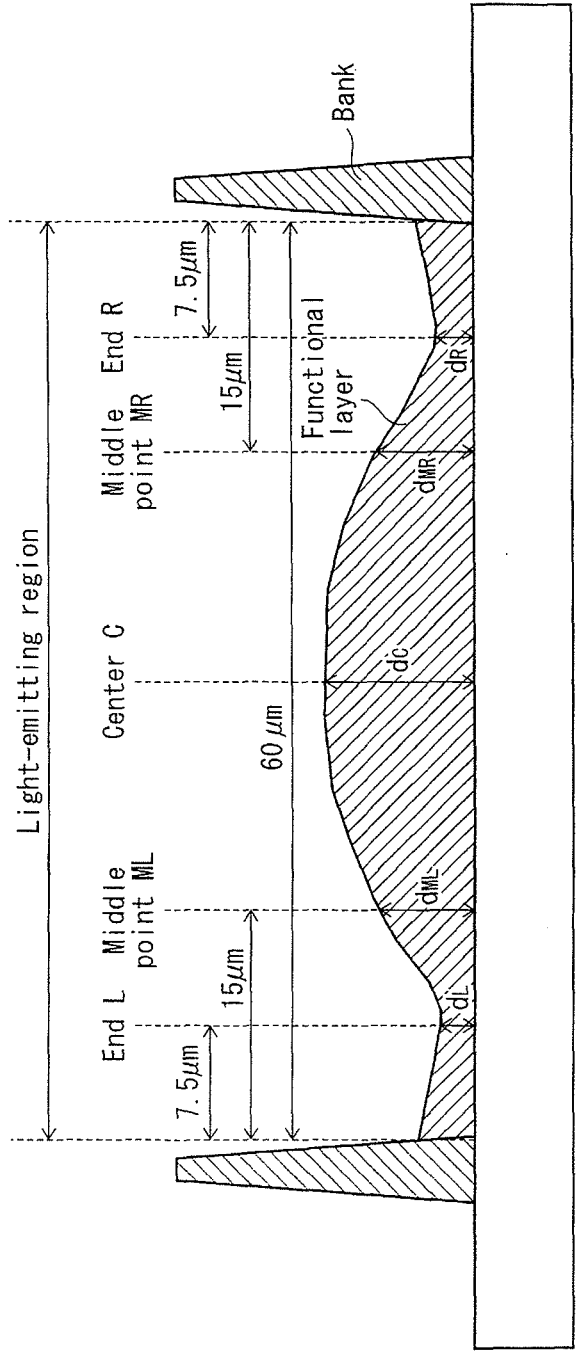
FIG. 7 illustrates ends and a center of a functional layer.

FIG. 7 illustrates "ends" and a "center" of a functional layer. In the present invention, a center of a functional layer is an area corresponding to a center of a light-emitting region of an organic light-emitting element including the functional layer, as illustrated in FIG. 7. Further, each of ends of a functional layer is an area corresponding to a distance of 12.5% of an entire length of the light-emitting region from a corresponding end of the light-emitting region towards the center of the light-emitting region. In specific, when the entire length of the light-emitting region is 60 μm, each end of a functional layer is located at a distance of 7.5 μm from a corresponding end of the light-emitting region. Note that the ends of a light-emitting region as described above correspond to, for example, two edges of a top surface of a functional layer.

Further, the inventors decided to evaluate a degree of planarity of a functional layer by additionally using the difference between the film thickness of a functional layer at a central portion of the functional layer and the film thickness of the functional layer at middle points of the functional layer so as to realize a more precise evaluation of the degree of planarity of the functional layer. In specific, the inventors decided to evaluate a degree of planarity of a functional layer by applying a planarity degree $PI_M$. A planarity degree $PI_M$, which indicates a degree of planarity of a functional layer, is calculated by subtracting, from a value indicating the film thickness at a central portion of the functional layer, a value which is an average of values each indicating the film thickness of the functional layer at one of left and right middle points.

As indicated in [Equation 3] below, a planarity degree $PI_M$ of a functional layer is indicated by using $d_C$, which indicates the film thickness of the functional layer at a central portion within a light-emitting region of an organic light-emitting element including the functional layer, and $d_{ML}$ and $d_{MR}$, which respectively indicate the film thickness of the functional layer at one middle point within the light-emitting region and the film thickness of the functional layer at the other middle point within the light-emitting region. The middle points are each located between a corresponding end portion within the light-emitting region and the central portion within the light-emitting region. Further, a negative value of a planarity degree $PI_M$ indicates that a corresponding functional layer has a concave shape, whereas a positive value of a planarity degree $PI_M$ indicates that a corresponding functional layer has a convex shape. In addition, an absolute value of a planarity degree $PI_M$ indicates a degree of concavity/convexity of a corresponding functional layer.

$$PI_M = d_C - (d_{ML} + d_{MR})/2 \qquad \text{[Equation 3]}$$

$PI_M$: a planarity degree of a functional layer, $d_C$: the film thickness of the functional layer at a central portion, $d_{mL}$: the film thickness of the functional layer at one middle portion, $d_{MR}$: the film thickness of the functional layer at the other middle portion In the present invention, each of middle points of a functional layer is an area of a light-emitting region of an organic light-emitting layer including the functional layer that corresponds to a distance of 25% of an entire length of the light-emitting region from a corresponding end of the light-emitting region, as illustrated in FIG. 7. In specific, when the entire length of the light-emitting region is 60 μm, each middle point of a functional layer is an area of the light-emitting region corresponding to a distance of 15 μm from a corresponding end of the light-emitting region.

Note that values of the planarity degree PI and the planarity degree $PI_M$ presented in the following are values for a functional layer having an average film thickness (an average film thickness between end portions of the functional layer) of 80 nm. In cases where a functional layer that was actually formed did not have an average film thickness of 80 nm, the values of the planarity degree PI and the planarity degree $PI_M$ for such a functional layer were obtained by conversion being performed so as to obtain values that are in accordance with the average film thickness of 80 nm.

[Solvent Mixture Ratio]

It is exemplary that the first solvent and the second solvent be mixed in a mixing ratio such that the level of the top surface of the functional layer will become uniform throughout from the end portions to the central portion and the thickness of the functional layer will become uniform from the end portions to the central portion. The investigation carried out to determine an exemplary mixing ratio for mixing the first solvent and the second solvent revealed that a planar functional layer can be yielded by mixing the two solvents at a ratio where a term corresponding to one solvent is a reciprocal of an absolute value of a planarity degree PI of a functional layer formed by using the solvent.

Figure 8:
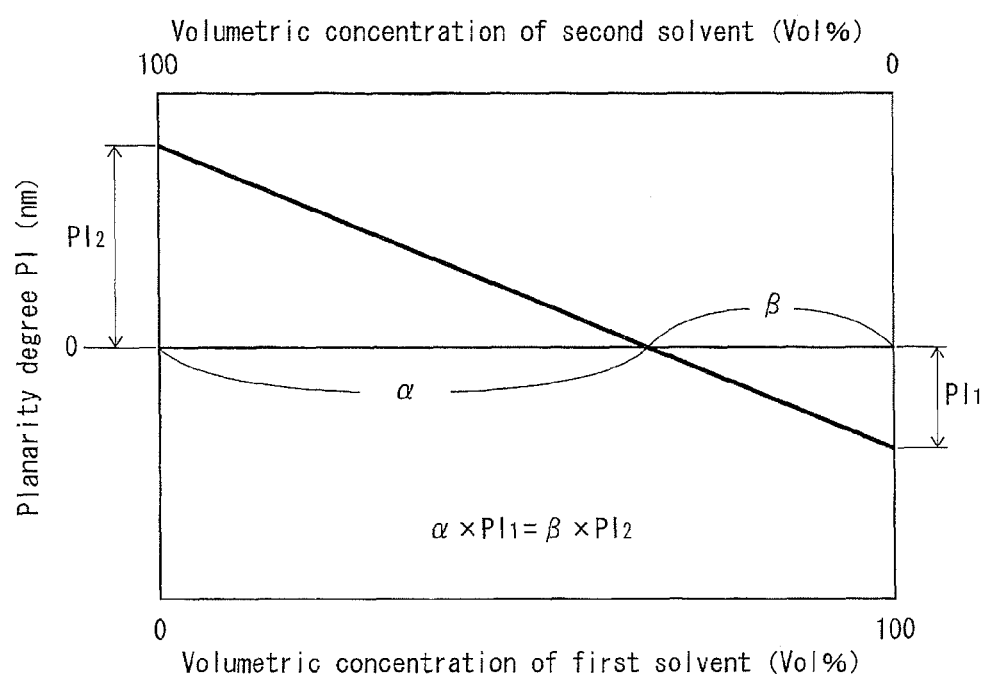
FIG. 8 illustrates a mixing ratio $\alpha/\beta$.

FIG. 8 illustrates a mixing ratio $\alpha/\beta$. It is exemplary that the first solvent and the second solvent be mixed according to a mixing ratio $\alpha/\beta$, as illustrated in FIG. 8. The mixing ratio $\alpha/\beta$ is defined by a, which is a reciprocal of an absolute value of a planarity degree $PI_1$ in [Equation 2] above, and $\beta$, which is a reciprocal of an absolute value of a planarity degree $PI_2$ in [Equation 2] above.

Figure 9:
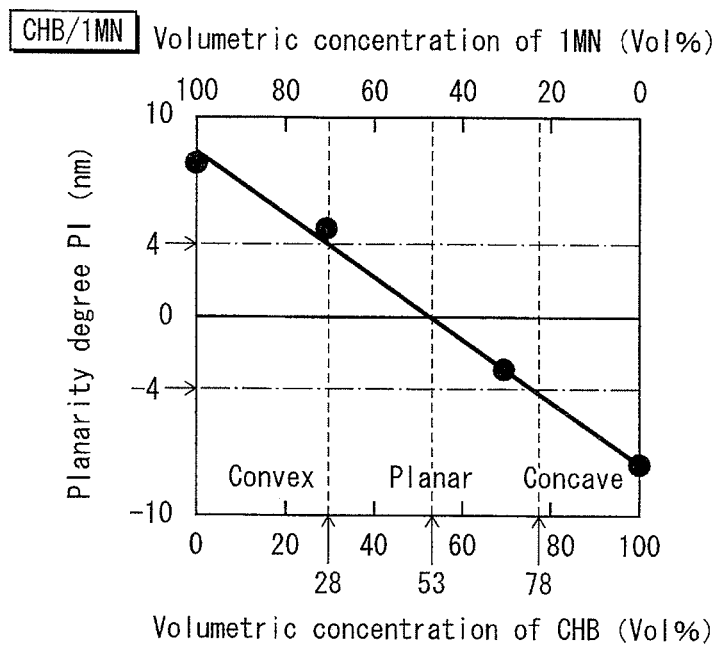
FIG. 9 illustrates results of consideration carried out concerning a mixing ratio $\alpha/\beta$ for a combination of CHB and 1MN.

FIG. 9 illustrates a result of consideration carried out concerning the mixture ratio $\alpha/\beta$ when mixing CHB and 1MN. In implementation example 1, where the first solvent is CHB and the second solvent is 1MN, it is exemplary that a mixing ratio $\alpha/\beta$ according to which CHB and 1MN are mixed be set within a range of 28/72 to 78/22, inclusive. It is further exemplary that the mixing ratio $\alpha/\beta$ be set to 53/47. By setting the mixing ratio $\alpha/\beta$ within the range of 28/72 to 78/22, a planarity degree PI of a functional layer formed by using a solvent mixture-type ink including HB and 1 MN can be set within a range of ±4 nm, inclusive. Further, by setting the mixing ratio $\alpha/\beta$ to 53/47, the planarity degree PI of the functional layer formed by using the solvent mixture-type ink including HB and 1MN can be set to 0 nm.

It is known that a life-span of an organic light-emitting element is shortened when unevenness in film thickness exists in a functional layer included in the organic light-emitting element. This problem occurs due to electric field concentration taking place at portions of the functional layer having comparatively small film thicknesses than other portions. As a result, electricity conducted by such portions of the functional layer increases, and accordingly, extreme degradation of the functional layer at such portions is brought about. In addition, it is also known that an organic light-emitting element having an acceptable life-span can be yielded by suppressing the unevenness in film thickness of a functional layer included in the organic light-emitting element to within 10% of an overall film thickness of the functional layer. Taking this into account, since the functional layers formed in the experiments conducted by the inventors had an overall film thickness 80 nm, the life span of organic light-emitting elements including such functional layers can be prevented from being shortened when the unevenness in film thickness of the functional layers is within the above-described range of ±4 nm.

Figure 10:
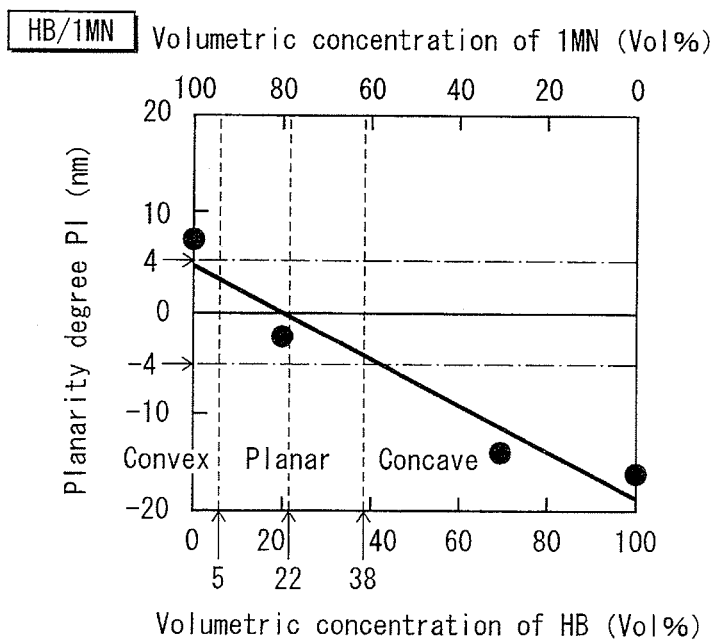
FIG. 10 illustrates results of consideration carried out concerning a mixing ratio $\alpha/\beta$ for a combination of HB and 1MN.

FIG. 10 illustrates a result of consideration carried out concerning the mixture ratio $\alpha/\beta$ when mixing HB and 1MN. In implementation example 2, where the first solvent is HB and the second solvent is 1MN, it is exemplary that a mixing ratio $\alpha/\beta$ according to which HB and 1MN are mixed be set within a range of 5/95 to 38/62, inclusive. It is further exemplary that the mixing ratio $\alpha/\beta$ be set to 22/78. By setting the mixing ratio $\alpha/\beta$ within the range of 5/95 to 38/62, a planarity degree PI of a functional layer formed by using a solvent mixture-type ink including HB and 1MN can be set within a range of ±4 nm, inclusive. Further, by setting the mixing ratio $\alpha/\beta$ to 22/78, the planarity degree PI of the functional layer formed by using the solvent mixture-type ink including HB and 1MN can be set to 0 nm.

The results of implementation examples 1 and 2 revealed that it is exemplary to prepare an ink for forming a functional layer such that the first solvent and the second solvent are present in the ink each in an amount within ±15 vol %, inclusive, of their individual volumetric concentration determined according to the mixing ratio $\alpha/\beta$. As described above, when an ink is prepared by mixing the first solvent and the second solvent at a mixing ratio $\alpha/\beta$, a planarity degree PI of a functional layer formed by using such an ink is 0 nm. By setting the amount of each of the first solvent and the second solvent in an ink in such a manner, a planarity degree PI of a functional layer formed by using such an ink can be set within the range of ±4 nm.

As explanation has been provided in the above, an exemplary mixing ratio that yields a functional layer having a high degree of planarity can be obtained by simply calculating (i) a planarity degree PI of an imitatively formed functional layer that is to be formed by using a single solvent-type ink including only the first solvent and (ii) a planarity degree PI of an imitatively formed functional layer that is to be formed by using a single solvent-type ink including only the second solvent. Similarly, an exemplary mixing ratio that yields a functional layer having a high degree of planarity can be obtained by calculating a planarity degree $PI_1$ of an imitatively formed functional layer that is to be formed by replacing the second solvent with the first solvent and a planarity degree $PI_2$ of an imitatively formed functional layer that is to be formed by replacing the first solvent with the second solvent.

[Difference in Boiling Points of Various Solvents]

In the above, it has been mentioned that a functional layer having a high degree of planarity can be formed when the first solvent and the second solvent included in the solvent mixture-type ink have equal or similar boiling points. The inventors investigated when the first solvent and the second solvent can be considered as having "equal or similar" boiling points. That is, the inventors attempted to determine an acceptable range of the difference in boiling points of the first solvent and the second solvent.

Figure 11:
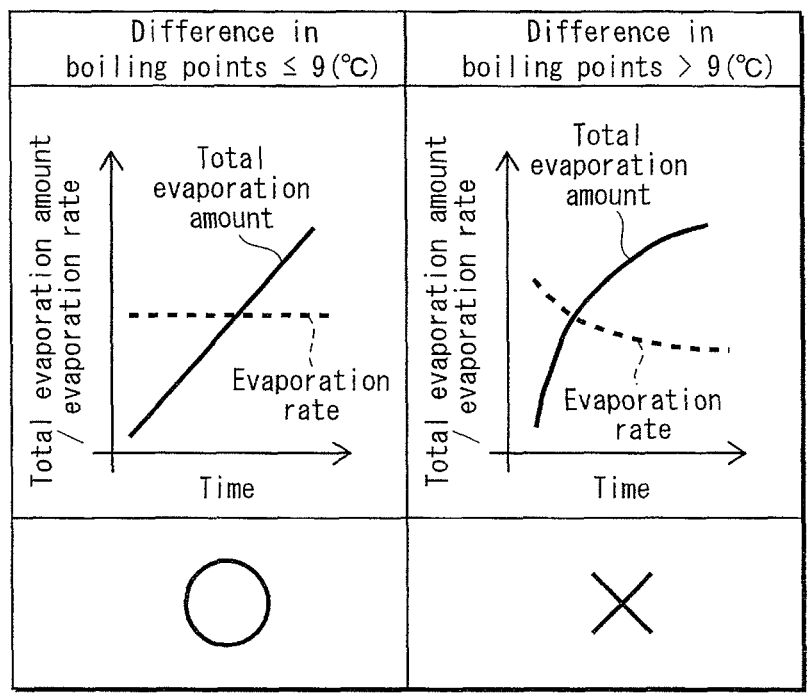
FIG. 11 illustrates an influence that a difference in boiling points of solvents has on evaporation of the solvents.

FIG. 11 illustrates an influence that a difference in boiling points of solvents has on evaporation of the solvents. In conclusion, it is exemplary that the difference in boiling point between the first solvent and the second solvent be equal to or smaller than 9° C., as illustrated in FIG. 11.

When the difference in boiling points of the first solvent and the second solvent was equal to or smaller than 9° C., the first solvent and the second solvent evaporated at a similar timing. Hence, the mixed solvent composed of the first solvent and the second solvent evaporated at a constant rate regardless of the time having elapsed since the beginning of evaporation, and similarly, the total evaporation amount of the mixed solvent increased at a constant rate. When the first solvent and the second solvent evaporate in the above-described manner, control of the atmospheric environment in the drying process is facilitated, and it is likely that a functional layer having a high degree of planarity is yielded. Hence, the difference in boiling points of the first solvent and the second solvent when the first solvent and the second solvent evaporate in the above-described manner was judged as being exemplary (judged as "o").

In contrast, when the difference in boiling points of the first solvent and the second solvent exceeded 9° C., the first solvent and the second solvent did not evaporate at a similar timing, and the solvent having a lower boiling point evaporated at a faster rate than the other solvent. Hence, the mixed solvent composed of the first solvent and the second solvent evaporated at an inconstant rate which changed according to the time having elapsed since the beginning of the evaporation, and similarly, the total evaporation amount of the mixed solvent increased at an inconstant rate. When the first solvent and the second solvent evaporate in the above-described manner, it is not easy to control a ratio of the solvents composing an ink at a point where a functional layer is actually formed by making arrangements to ink formation, and therefore, it is not easy to yield a functional layer having a high degree of planarity. Hence, the difference in the boiling points of the first solvent and the second solvent when the first solvent and the second solvent evaporate in the above-described manner was judged as not being exemplary (judged as "x"). In such a case, the rate at which the mixed solvent evaporated changed since the solvent having a lower boiling point, among the first solvent and the second solvent, evaporated mainly during a period immediately following the beginning of evaporation, and since the other solvent having a higher boiling point evaporated mainly after a certain period of time had elapsed since the beginning of evaporation and when the amount of the solvent having a lower boiling point in the mixed solvent had decreased. The solvent having a higher boiling point evaporated at a slower rate compared to the solvent having a lower boiling point, which resulted in the inconstant rate at which the mixed solvent evaporated.

FIG. 12 illustrates results of consideration carried out concerning an influence that a difference in boiling points between solvents has on shapes of functional layers. As illustrated in FIG. 12, various solvent mixture-type inks were prepared by using various combinations of a solvent corresponding to the first solvent and a solvent corresponding to the second solvent. Further, an evaluation was performed of the solvent mixture-type inks prepared in such a manner concerning whether or not the solvents included in such solvent mixture-type inks evaporate at a constant rate. In conclusion, the evaporation of solvents from the solvent mixture-type inks took place at a constant rate when the difference in boiling points of the solvents was equal to or smaller than 9° C. Hence, cases where the difference in boiling points of the solvents was equal to or smaller than 9° C. were judged as being exemplary (judged as "o"). On the other hand, the evaporation of solvents from the inks did not take place at a constant rate when the difference in boiling points of the solvents included in the ink exceeded 9° C. Hence, cases where the difference in the boiling points of the solvents exceeded 9° C. were judged as not being exemplary (judged as "x").

Note that, although the combination of CHB and HB was judged as being exemplary (judged as "o") since the difference in boiling points of the solvents was equal to or smaller than 9° C. and the solvents evaporated from the ink at a constant rate, a functional layer having a high degree of planarity was not yielded by using the ink including the combination. This is since CHB and HB is a combination of solvents both having concavity-forming characteristics.

In contrast, the combination of CHB and PT (phenoxytoluene) yielded a functional layer having a high degree of planarity even though the mixed solvent evaporated from the ink at an inconstant rate. It is considered that such a result was obtained since one of the solvents (i.e. PT) had a higher boiling point and a higher viscosity compared to the other solvent. Hence, the other solvent completely evaporated from the ink while the evaporation of the solvent having a higher boiling point was still in progress, which resulted in the solvent having a higher boiling point remaining in the ink. The high viscosity of the solvent having a higher boiling point remaining in the ink contributed in yielding a functional layer having a high degree of planarity.

This method of increasing the planarity of a functional layer by: (i) preparing an ink by using a combination of a solvent having a relatively low boiling point and a solvent having a relatively high boiling point; (ii) keeping the viscosity of the ink at a low level upon ejection; and (iii) causing the solvent having the relatively low boiling point to evaporate quickly from the ink when the ink has been filled between banks of an organic light-emitting element and causing the viscosity of the ink to increase quickly, and thereby suppressing the flow of the ink is conventionally known (Patent Literature 3). However, the use of a combination of two types of solvents having considerably different boiling points is problematic. This is since, when compared with a method where a combination of two types of solvents having similar boiling points is used, it is not easy to control the ratio of the solvents included in the ink at a point where a functional layer is actually formed by making arrangements to ink formation, and therefore, it is not easy to yield a functional layer having a high degree of planarity.

In view of such problems, the ink pertaining to one aspect of the present invention facilitates the forming of a functional layer having a high degree of planarity since the ink includes a combination of two solvents having equal or similar boiling points, and further, the solvents included in the ink are caused to evaporate at a similar timing. This technical idea cannot be easily arrived at based on the method as disclosed in Patent Literature 2, where two solvents having considerably different boiling points are purposefully used.

In addition, concerning the boiling points of the solvents included in the ink, it is exemplary that the solvent having a convexity-forming characteristic have a higher boiling point than the solvent having a concavity-forming characteristic. That is, it is exemplary that the boiling point of the second solvent is higher than the boiling point of the first solvent. This is since when the second solvent has a higher boiling point than the first solvent, the second solvent remains in the ink longer than the first solvent. Hence, the influence of the characteristic of the second solvent remains strong until immediately before the shape of the functional layer is fixed. Since the second solvent has a characteristic of suppressing the functional material in the ink from unevenly residing at ends of the ink puddle formed by the ejected ink, a functional layer having a high degree of planarity is likely to be formed. Note that, in the present disclosure, two solvents are judged as having "equal or similar" boiling points when the difference in boiling points of the solvents is equal to or smaller than 9° C. More specifically, a functional layer having a high degree of planarity is likely to be formed (i) when the difference in boiling points of the solvents is within this range and (ii) when the solvent having a convexity-forming characteristic has a higher boiling point than the solvent having a concavity-forming characteristic.

[Value γ]

In the following, explanation is provided of a method according to which a shape of a functional layer to be formed and a planarity degree PI of the functional layer to be formed can be easily estimated based on a physical property of an ink to be used to form the functional layer and without actually forming the functional layer.

FIG. 13 is a diagram explaining the Marangoni Number. As illustrated in FIG. 13 and when referring to the Marangoni Number, it could be seen that the viscosity and the surface tension of a liquid influence the fluidity of the liquid. Inspired by this, the inventors arrived at a method for estimating a planarity degree PI of a functional layer according to the viscosity and the surface tension of an ink to be used in forming the functional layer.

In specific, a planarity degree PI of a functional layer can be estimated according to a value $\gamma$, which is the ratio ($\sigma/\eta$) of the surface tension $\sigma$ (mN·m$^{-1}$) of the ink to the viscosity $\eta$ (mPa·s) of the ink.

FIG. 14 illustrates a relation between a value $\gamma$ of an ink and a planarity degree PI of a functional layer to be formed by using the ink. As illustrated in FIG. 14, (i) when a value $\gamma$ of an ink satisfied $\gamma=1.9$, a functional layer formed by using the ink exhibited a planar shape, (ii) when a value $\gamma$ of an ink satisfied $\gamma>1.9$, a functional layer formed by using the ink exhibited a concave shape, and (iii) when a value $\gamma$ of an ink satisfied $\gamma<1.9$, a functional layer formed by using the ink exhibited a convex shape. From this, it could be seen that $\gamma=1.9$ is the threshold value between the two shapes of a functional layer, namely a concave shape and a convex shape.

Further, (i) when a value $\gamma$ of an ink satisfied $\gamma=1.9$, a planarity degree PI of a functional layer formed by using the ink satisfied PI=0 nm, (ii) when a value $\gamma$ of an ink satisfied $\gamma<1.9$, a planarity degree PI of a functional layer formed by using the ink satisfied PI>0 nm, and (iii) when a value $\gamma$ of an ink satisfied $\gamma>1.9$, a planarity degree PI of a functional layer formed by using the ink satisfied PI<0 nm. From this, it could be seen that an ink having a value $\gamma$ closer to 1.9 has a stronger ability of forming a planar functional layer.

Figure 16:
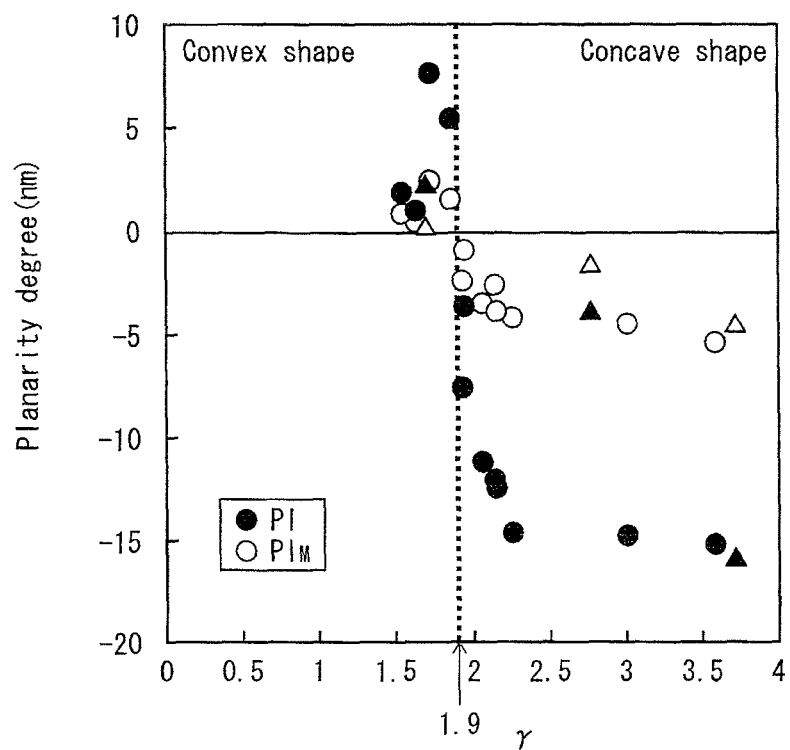
FIG. 16 illustrates results of consideration carried out concerning a relation between a value $\gamma$ and a planarity degree PI.

FIGS. 15 and 16 illustrate results of consideration carried out concerning a relation between a value $\gamma$ of an ink and a planarity degree PI of a functional layer formed by using the ink. Note that measurement of the viscosity $\eta$ of an ink was performed by using the AR-G2 viscometer (TA Instruments). Similarly, the measurement of the surface tension $\gamma$ of an ink was performed by using the DSA100 tensiometer (KRUSS).

Evaluation was performed of the relation between a value $\gamma$ of an ink and a planarity degree PI of the ink for each of functional layers imitatively formed by using various single solvent-type inks and functional layers formed by using various solvent mixture-type inks, as illustrated in FIGS. 15 and 16. Through the evaluation, it was observed that (i) when a value $\gamma$ of an ink satisfied $\gamma<1.9$, a planarity degree PI of a functional layer formed by using the ink satisfied PI>0 and (ii) when a value $\gamma$ of an ink satisfied $\gamma>1.9$, a planarity degree PI of a functional layer formed by using the ink satisfied PI<0. From this, it was revealed that a correlation exists between a value $\gamma$ of an ink and a planarity degree PI of a functional layer formed by using the ink. Similarly, it was revealed that a correlation exists between a value $\gamma$ of an ink and a planarity degree $PI_M$ of a functional layer formed by using the ink, since it was observed that (i) when a value $\gamma$ of an ink satisfied $\gamma<1.9$, a planarity degree $PI_M$ of a functional layer formed by using the ink satisfied $PI_M>0$ and (ii) when a value $\gamma$ of an ink satisfied $\gamma>1.9$, a planarity degree $PI_M$ of a functional layer formed by using the ink satisfied $PI_M<0$.

The above-described results revealed that an ink forming a functional layer having a high degree of planarity can be yielded by preparing an ink such that a value $\gamma$ of the ink satisfies $\gamma=1.9$.

Here, it is exemplary that the first solvent and the second solvent be mixed in a mixing ratio such that the level of the top surface of the functional layer will become uniform throughout from the end portions to the central portion and the thickness of the functional layer will become uniform from the end portions to the central portion. So as to make this possible, it is exemplary that the first solvent and the second solvent be mixed at a mixing ratio that forms a functional layer having a planarity degree PI satisfying PI=0 nm. Thus, it is exemplary that the functional material, the first solvent, and the second solvent be mixed such that a value $\gamma$ of the ink satisfies $\gamma=1.9$. Further, the mixing ratio for an ink whose value $\gamma$ satisfies $\gamma=1.9$ can be calculated according to a value $\gamma$ of a single solvent-type ink including the first solvent and a value $\gamma$ of a single solvent-type ink including the second solvent.

[Influence of Film Thicknesses of Functional Layers]

Figure 18A:
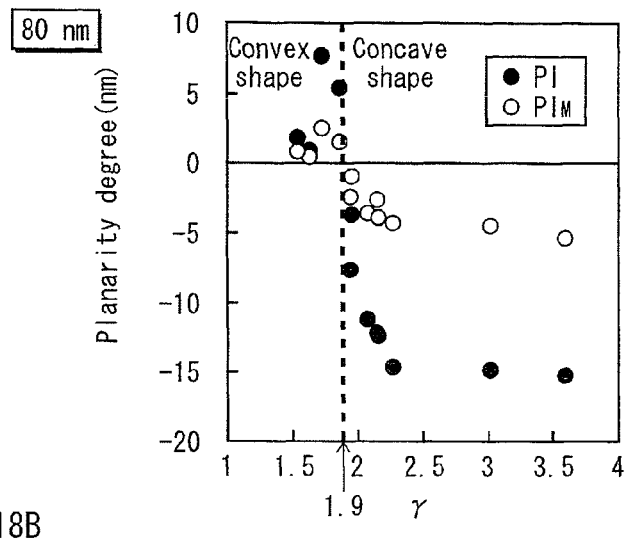
FIGS. 18A through 18C illustrate results of consideration carried out concerning an influence that film thicknesses of functional layers have on planarity degrees PI of the functional layers.
Figure 18B:
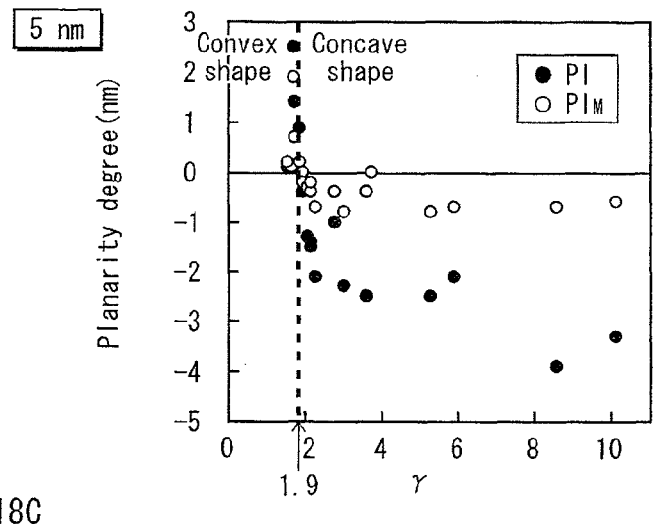
Figure 18C:
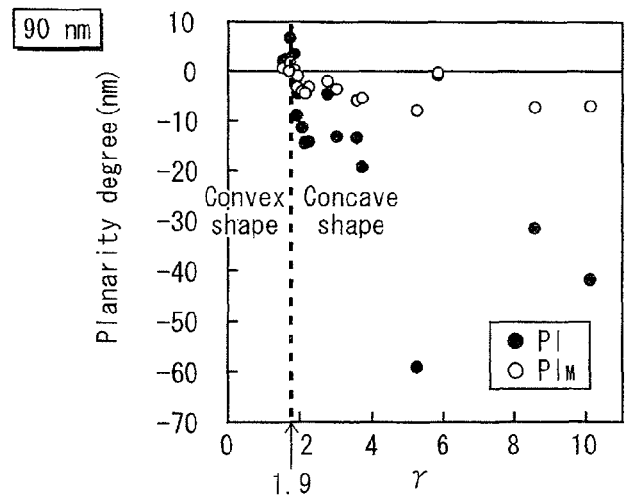

The inventors investigated the influence that the film thickness of functional layers has on the above-described evaluation based on the threshold value $\gamma=1.9$. FIG. 17 illustrates results of consideration carried out concerning an influence that film thicknesses of functional layers have on planarity degrees PI of the functional layers. Evaluation was performed of planarity degrees PI and planarity degrees $PI_M$ of various functional layers having various film thicknesses, which include functional layers imitatively formed by using various single solvent-type inks and functional layers formed by using various solvent mixture-type inks, as illustrated in FIG. 17. FIGS. 18A, 18B, and 18C each illustrate results of the above-described evaluation for a corresponding film thickness. More specifically, FIG. 18A indicates the results of the evaluation when the film thickness of the functional layers was 80 nm, FIG. 18B indicates the results of the evaluation when the film thickness of the functional layer was 5 nm, and FIG. 18C indicates the results of the evaluation when the film thickness of the functional layer was 90 nm. In each of the cases illustrated in FIGS. 18A, 18B, and 18C, it was observed that $\gamma=1.9$ is the threshold value between positive values of planarity degrees PI and negative values of planarity degrees PI.

From this, the inventors reached a conclusion that the film thicknesses of the functional layers do not particularly influence the above-described evaluation based on the threshold value $\gamma=1.9$. More specifically, it was confirmed that the film thicknesses of the functional layers do not influence the evaluation of planarity degrees PI of the functional layers based on the threshold value $\gamma=1.9$, at least when the film thicknesses of the functional layers are within a range of 5 to 90 nm, inclusive.

[Influence of Shapes of Banks]

Note that all of the above-described experiments have been carried out by using organic light-emitting elements having banks that form a line bank structure. Additionally, the inventors investigated whether the same results can be obtained when similar experiments are carried out by using organic light-emitting elements having banks that form a pixel bank structure.

Figure 19:
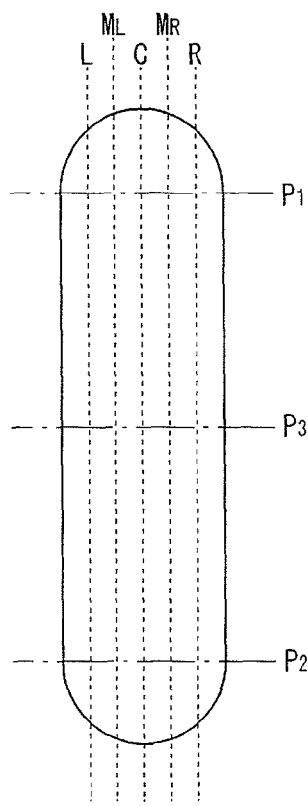
FIG. 19 illustrates ends of a functional layer in a pixel bank structure.

FIG. 19 is a diagram explaining both end points of the functional layer when an organic light-emitting element has banks that form a pixel bank structure. As illustrated in FIG. 19, a functional layer of an organic light-emitting element having a pixel bank structure exhibits a rectangular shape in plan view. Further, ends of a light-emitting region of the organic light-emitting element pertaining to the present embodiment correspond to ends of a functional layer in the short side direction, and in FIG. 19, "L" and "R" respectively indicate ends L and R of a functional layer. In addition, "C" in FIG. 19 indicates a center C of a functional layer, and "$M_L$" and "$M_R$" respectively indicate middle points $M_L$ and $M_R$ of a functional layer. In the experiments, measurement was performed of shapes of functional layers at "$P_3$", which is an intermediate location between "$P_1$" and "$P_2$" along the long side direction of a functional layer. Note that between "$P_1$" and "$P_2$", a functional layer exhibits a uniform length in the short side direction in FIG. 19.

Figure 20:
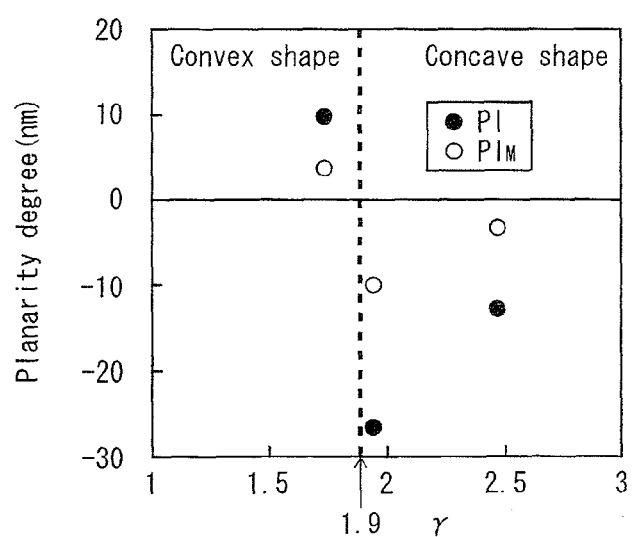
FIG. 20 illustrates results of consideration carried out concerning a relation between a value $\gamma$ and a planarity degree PI in a pixel bank structure.

FIG. 20 illustrates results of consideration carried out concerning the relation between planarity degrees PI of functional layers of organic light-emitting elements having banks forming a pixel bank structure and values γ of inks for forming the functional layers. As illustrated in FIG. 20, the threshold value between positive values of the planarity degree PI and negative values of the planarity degree PI was γ=1.9 for functional layers included in organic light-emitting elements having banks forming a pixel bank structure, which was similar to the threshold value for functional layers included in organic light-emitting elements having banks forming a line bank structure.

[Organic Light-Emitting Element]

Figure 21:
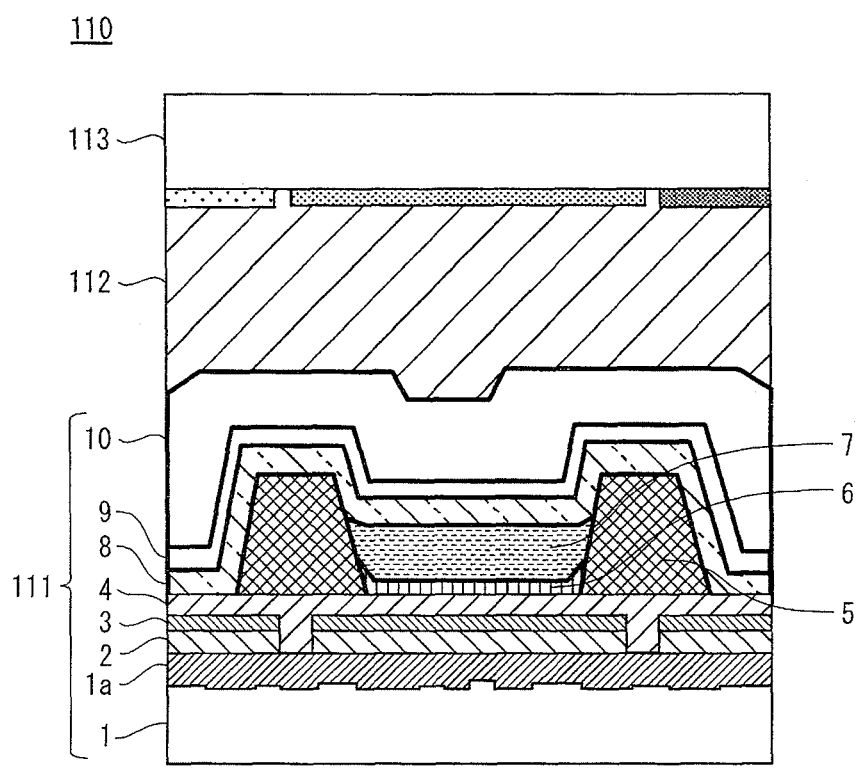
FIG. 21 is a schematic diagram illustrating a state in which layers of an organic light-emitting element pertaining to one aspect of the present invention are layered.

FIG. 21 is a schematic diagram illustrating a state in which layers of an organic light-emitting element pertaining to one aspect of the present invention are layered. As illustrated in FIG. 21, an organic display panel 110 has a structure in which a color filter substrate 113 is laminated on an organic light-emitting element (functional member) 111 pertaining to one aspect of the present invention via a sealing member 112.

The organic light-emitting element 111 is a top emission type organic light-emitting element in which subpixels corresponding to the colors R, G, and B are arranged so as to form lines or to form a matrix. Further, each subpixel has a layered structure where various layers are layered above a TFT substrate 1.

A first anode electrode 2 and a second anode electrode 3, which compose the first electrode in combination, are formed on the TFT substrate 1 so as to form lines or to form a matrix on the TFT substrate 1. A hole injection layer 4 is layered on the combination of the anode electrodes 2 and 3. Banks 5 defining each subpixel of the organic light-emitting element 111 are formed on the hole injection layer 4. Further, a hole transport layer 6 and an organic light-emitting layer 7 are layered in the stated order within each area defined by the banks 5. Further, an electron transport layer 8, a cathode electrode 9 corresponding to the second electrode, and an encapsulation layer 10 are formed on the organic light-emitting layer 7. Here, note that the electron transport layer 8, the cathode electrode 9, and the encapsulation layer 10 are formed so as to extend over the areas defined by the banks 5 to be continuous between adjacent subpixels.

As such, within one area defined by the banks 5, multiple layers, namely the hole injection layer 4, the hole transport layer 6, the organic light-emitting layer 7 and the electron transport layer 8, are layered in the stated order, thereby forming a functional layer. Note that the functional layer may include other layers, such as an electron injection layer, in addition to the layers described above.

Examples of typical structures of the functional layer include: (i) hole injection layer+organic light-emitting layer; (ii) hole injection layer+hole transport layer+organic light-emitting layer; (iii) hole injection layer+organic light-emitting layer+electron injection layer; (iv) hole injection layer+hole transport layer+organic light-emitting layer+electron injection layer; (v) hole injection layer+organic light-emitting layer+hole blocking layer+electron injection layer; (vi) hole injection layer+hole transport layer+organic light-emitting layer+hole blocking layer+electron injection layer; (vii) organic light-emitting layer+hole blocking layer+electron injection layer; (viii) organic light-emitting layer+electron injection layer, etc.

The TFT substrate 101 includes a base substrate and an amorphous TFT (organic light-emitting element drive circuit) formed on the base substrate. The base substrate is, for example, composed of an insulating material such as alkali-free glass, soda glass, nonfluorescent glass, phosphate glass, borate glass, quartz, acrylic resin, styrenic resin, polycarbonate resin, epoxy resin, polyethylene, polyester, silicone resin, and alumina.

The first anode electrode 2 is composed of, for example, silver (Ag), APC (alloy of silver, palladium and copper), ARA (alloy of silver, rubidium and gold), MoCr (alloy of molybdenum and chromium), or NiCr (alloy of nickel and chromium). Further, for a top emission type organic light-emitting element, it is exemplary that the first anode electrode 2 be formed by using light-reflective material.

The second anode electrode 3 is interposed between the first anode electrode 2 and the hole injection layer 4, and has the function of enhancing the bonding between the first anode electrode 2 and the hole injection layer 4.

It is exemplary that the hole injection layer 4 be formed by using a metal compound such as a metal oxide, a metal nitride, and a metal oxynitride. When the hole injection layer 4 is composed of a metal oxide, the injection of holes into the organic light-emitting layer 7 is facilitated. Accordingly, the electrons injected into the organic light-emitting layer 7 contribute in an effective manner to the emission of light, which results in excellent light-emitting characteristics of the organic light-emitting layer 7. Examples of metal oxides include oxides of Cr (chromium); Mo (molybdenum); W (tungsten); V (vanadium); Nb (niobium); Ta (tantalum); Ti (titanium); Zr (zircon); Hf (hafnium); Sc (scandium); Y (yttrium); Th (thorium); Mn (manganese); Fe (iron); Ru (ruthenium); Os (osmium); Co (cobalt); Ni (nickel); Cu (copper); Zn (zinc); Cd (cadmium); Al (aluminum); Ga (gallium); In (indium); Si (silicon); Ge (germanium); Sn (stannum); Pb (lead); Sb (antimony); and Bi (bismuth), and oxides of so-called rare earth metals from La (lanthanum) to Lu (lutetium) in the periodic table, etc. Among such metal oxides, $Al_2O_3$ (aluminum oxide), CuO (cupric oxide), and SiO (silicon monoxide) are particularly efficient for realizing an extended life-span of the organic light-emitting element.

It is exemplary that the banks 5 be formed by using, for example, organic material such as resin or inorganic material such as glass. Examples of organic material that can be used for forming the banks 5 include: acrylic resin; polyimide resin; and novolac type phenolic resin. On the other hand, examples of inorganic material that can be used for forming the banks 5 include: SiO, (silicon dioxide) and $Si_3N_4$ (silicon nitride). Further, it is exemplary that the banks 5 have resistance against organic solvents, transmit visible light to some extent, and have insulating properties. In addition, since there are cases where the banks 5 undergo etching, baking and other similar processing, it is exemplary that the banks 5 be formed by using a material having a high degree of resistivity against such processing.

Note that the banks 5 may either form a line bank structure or a pixel bank structure. When the banks 5 form a line bank structure, the banks 5 are formed so as to partition subpixels by columns or by rows. Further, in a line bank structure, the banks 5 exist at both sides of the organic light-emitting layer 7 in either the row direction or in the column direction. When the banks 5 form a line bank structure, the organic light-emitting layer 7 is formed so as to be continuous in either the column direction or the row direction. On the other hand, when the banks form a pixel bank structure, the banks 5 are formed so as to surround an organic light-emitting layer 7 corresponding to one subpixel from all directions.

The hole injection layer 6 has a function of transporting, to the organic light-emitting layer 7, holes injected from the anode electrodes 2 and 3. It is exemplary that the hole injection layer 6 be formed by using Poly(3,4-ethylenedioxythiophene) doped with poly(styrenesulfonate) (PEDOT-PSS) or a derivative thereof (copolymer or the like).

The organic light-emitting layer 7 has a function of emitting light by utilizing an electric-field light-emitting phenomenon. It is exemplary that the organic light-emitting layer 7 be formed, for example, by using functional material included in the ink pertaining to one aspect of the present invention. One example of a method for determining whether the organic light-emitting layer 7 has been formed by utilizing the ink for an organic light-emitting element pertaining to one aspect of the present invention, the manufacturing method for an organic light-emitting element pertaining to one aspect of the present invention, and the manufacturing method for a functional layer pertaining to one aspect of the present invention, is measuring the amount of the first solvent and the second solvent remaining in the organic light-emitting layer 7.

To provide one example of the application of such a method, an ink including CHB as the first solvent and HB as the second solvent was prepared. The organic light-emitting layer 7 was formed by using the ink and by applying the spin coating method. Subsequently, the organic light-emitting layer 7 so formed was vacuum dried for three minutes, and was subsequently subjected to bake processing at 170° C. for 30 minutes. Analysis of the organic light-emitting layer 7 so formed was performed by removing the organic light-emitting layer 7 and performing gas chromatography. The result of the analysis indicated that the amount of CHB remaining in the organic light-emitting layer 7 was 0.64 ng/cm$^2$, whereas the amount of HB remaining was 0.48 ng/cm$^2$.

The electron transport layer 8 has a function of transporting electrons injected from the cathode electrode 9 to the organic light-emitting layer 7. It is exemplary that the electron transport layer 8 be formed by using, for example, barium, phthalocyanine, lithium fluoride or a mixture of such materials, etc.

The cathode electrode 9 is formed, for example, by using ITO, IZO (indium zinc oxide) or the like. Further, for a top emission type organic light-emitting element, it is exemplary that the encapsulation layer 10 be formed by using light-transmissive material.

The encapsulation layer 10 inhibits the organic light-emitting layer 7 and the like from being exposed to moisture, air, etc., and is formed by using a material such as SiN (silicon nitride) and SiON (silicon oxynitride). Further, for a top emission type organic light-emitting element, it is exemplary that the encapsulation layer 10 be formed by using light-transmissive material.

The organic light-emitting element 111 having such a structure has excellent light-emitting characteristics since the organic light-emitting layer 7 has a high degree of planarity, which derives from characteristics of the ink used for forming the organic light-emitting layer 7.

[Manufacturing Method for Organic Light-Emitting Element]

In the following, explanation is provided of the method for manufacturing an organic light-emitting element pertaining to one aspect of the present invention with reference to FIGS. 22A through 22G and FIGS. 23A through 23E. At the same time, explanation is provided of the method for producing an ink for an organic light-emitting element and the method for forming a functional layer, each of which pertaining to one aspect of the present invention. Each of FIGS. 22A through 22G and FIGS. 23A through 23E illustrates a step in the method for manufacturing an organic light-emitting element pertaining to one aspect of the present invention.

First, the TFT substrate 1 is prepared. As illustrated in FIG. 22A, the upper surface of the TFT substrate 1 is protected by protective resist.

Next, as shown in FIG. 22B, the protective resist covering the TFT substrate 1 is removed, the organic resin is applied by spin coating to coat the TFT substrate 1, and the patterning is performed by the PR/PE (Photo Resist/Photo Etching) This allows a planarizing film 1a (which is, for example, 4 µm thick) to be formed, as shown in FIG. 22C.

Following this, the first anode electrode 2 is formed on the planarizing film 1a as illustrated in FIG. 22D. The first anode electrode 2 is formed, for example, by forming a thin film of APC by performing sputtering and by patterning the thin film by application of PR/PE so as to form a matrix. Accordingly, the first anode electrode 2 (having a thickness of, for example, 150 nm) is formed. Alternatively, the first anode electrode 2 may be formed by application of a vacuum deposition method or the like.

Subsequently, the second anode electrode 3 is formed in a matrix state as illustrated in FIG. 22E. More specifically, the second anode electrode 3 (having a thickness of, for example, 110 nm) is formed, for example, by forming an ITO thin film by application of a plasma deposition method and by patterning the ITO thin film by application of PR/PE.

Following this, the hole injection layer 4 is formed from over the second anode electrode 3 as illustrated in FIG. 22F. In specific, the hole injection layer 4 (having a thickness of, for example, 40 nm) is formed by sputtering material realizing a hole injection function and by performing patterning by application of PR/PE. Further, note that the hole injection layer 4 is formed not only above the anode electrode 3 but so as to cover the entire upper surface of the TFT substrate 1.

Subsequently, the banks 5 are formed above the hole injection layer 4 as illustrated in FIG. 22G. In specific, the banks 5 are formed at areas above the hole injection layer 4 corresponding to boundaries between areas where adjacent light-emitting layers are to be formed. The banks 5 (having, for example, a thickness of 1 µm) are formed by forming a bank material layer covering the entire upper surface of the hole injection layer 4 and further, by removing portions of the bank material layer by application of PR/PE. Note that the banks 5 may be formed so as to form a line bank structure, in which the banks 5 extend either in the column direction or the row direction, or may be formed so as to foiin a pixel bank structure, in which the banks 5 extend in both the column direction and the row direction and exhibit a lattice shape in plan view.

Following this, each of the concavities formed between the banks 5 is filled with an ink including material for forming the hole transport layer 6 as illustrated in FIG. 23A, and the hole transport layer 6 (having, for example, a thickness of 20 nm) is formed by causing the ink to dry.

Subsequently, the organic light-emitting layer 7 (having, for example, a thickness of 5-90 nm) is formed by filling a concavity between the banks 5 with the ink for an organic light-emitting element pertaining to one aspect of the present invention by applying the ink-jet method, and further, by drying the ink under, for example, a low-pressure environment with an atmospheric temperature of 25° C. and performing baking processing. Note that the concavities between the banks 5 are filled at all areas of the entire upper surface of the TFT substrate 1. Further, note that the method to be applied when filling the ink between the banks 5 is not limited to the ink jet method, and alternatively, a dispenser method, a nozzle coating method, a spin coating method, an intaglio printing method, a letter press printing method or the like may be applied.

More specifically, the organic light-emitting layer 7 is formed by the following steps 1 through 6 being carried out step-by-step.

In the first step, an ink to be used for forming the organic light-emitting layer 7 is prepared. The ink is produced by first preparing the functional material, the first solvent, and the second solvent, and then, by mixing the functional material, the first solvent, and the second solvent. The mixing of the ink may be performed by first preparing a mixed solvent by mixing the first solvent and the second solvent and then dissolving the functional material in the mixed solvent. Alternatively, the mixing of the ink may be performed by first dissolving the functional material in one of the solvents, and then adding the other solvent.

Further, when a third solvent other than the first solvent and the second solvent is to be included in the ink, the mixing of the solvents may be performed by first dissolving the functional material in the first solvent and the second solvent and then adding the third solvent, or by dissolving the functional material in the third solvent and then adding the first solvent and the second solvent.

The first solvent and the second solvents are mixed in a mixing ratio such that (i) the level of a top surface of the organic light-emitting layer 7 will become uniform throughout from ends of the organic light-emitting layer 7 to a center of the organic light-emitting layer 7, and (ii) the thickness of the organic light-emitting layer 7 will become uniform from the ends of the organic light-emitting layer 7 to the center of the organic light-emitting layer 7. In specific, the first solvent and the second solvent are mixed according to the above-described mixing ratio $\alpha/\beta$, for example.

In the second step, the ink is filled into an inkjet device having an ink ejection nozzle.

In the third step, a substrate having a base layer that includes the first electrode is prepared. In the present embodiment, the TFT substrate 1 having the first anode electrode 2, the second anode electrode 3, the hole injection layer 4, the banks 5, and the hole transport layer 6 layered thereon corresponds to the above-described substrate.

In the fourth step, the inkjet device is caused to eject droplets of the ink with respect to the hole transport layer 6.

In the fifth step, the ink droplets ejected in the fourth step are applied onto the hole transport layer 6 so as to form an ink droplet film.

In the sixth step, the first solvent and the second solvent are caused to evaporate from the ink droplet film so formed, and the organic light-emitting layer 7 is formed such that (i) the level of a top surface of the organic light-emitting layer 7 will become uniform throughout from ends of the organic light-emitting layer 7 to a center of the organic light-emitting layer 7, and (ii) the thickness of the organic light-emitting layer 7 will become uniform from the ends of the organic light-emitting layer 7 to the center of the organic light-emitting layer 7. Here, since the first solvent and the second solvent have equal or similar boiling points, the first solvent and the second solvent evaporate at a similar timing. The timing at which the first solvent and the second solvent are caused to evaporate is controlled by controlling the atmospheric environment. Here, the control of the atmospheric environment is facilitated since the first solvent and the second solvent evaporate at a similar timing. Note that the evaporation of the first solvent and the second solvent "at a similar timing" refers not only to a case where the first solvent and the second solvent evaporate exactly at the same time, but also a case where there is a slight difference between the timing at which the first solvent evaporates and the timing at which the second solvent evaporates. A slight difference between the timings at which the first solvent and the second solvent evaporate is acceptable provided that the mixing ratio of the solvents enabling the forming of the organic light-emitting layer 7 having a high degree of planarity is maintained.

Subsequently, the electron transport layer 8 (having, for example, a thickness of 20 nm) is formed so as to cover the banks 5 and the organic light-emitting layer 7 as illustrated in FIG. 23C by application of ETL deposition.

Following this, the second electrode having a polarity different from a polarity of the first electrode is formed above the functional layer as illustrated in FIG. 23D (the seventh step). In specific, the cathode electrode 9 (having a thickness of 100 nm) is formed above the electron transport layer 8 by plasma deposition of light-transmissive material.

Subsequently, the encapsulation layer 10 (having a thickness of 1 μm) is formed above the cathode electrode 9 by application of CVD as illustrated in FIG. 23E.

A top emission type organic light-emitting element is manufactured through the above-described procedures.

[Organic Display Apparatus]

Figure 24:
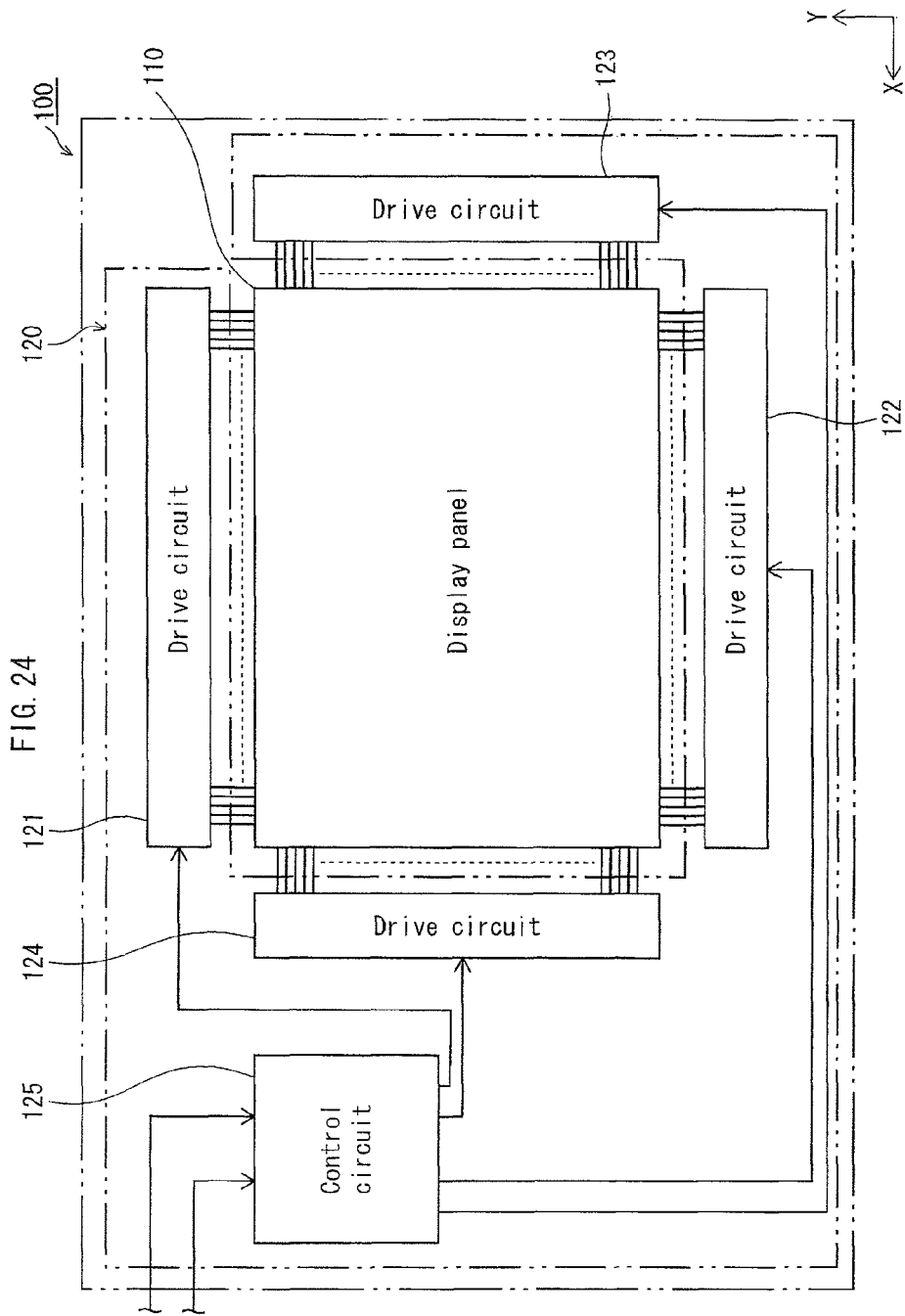
FIG. 24 illustrates an overall structure of an organic display device pertaining to one aspect of the present invention.
Figure 25:
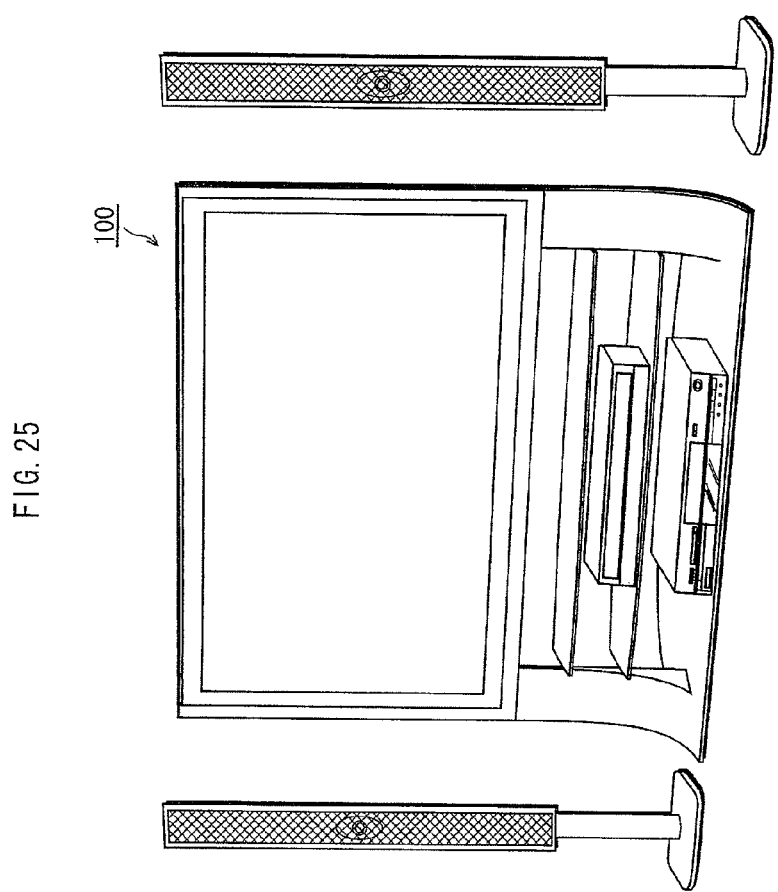
FIG. 25 is a perspective view illustrating a television system in which is incorporated the organic display device pertaining to one aspect of the present invention.

In the following, explanation is provided of the organic display device (display device) pertaining to one aspect of the present invention with reference to FIGS. 24 and 25. FIG. 24 illustrates an overall structure of the organic display device pertaining to one aspect of the present invention. FIG. 25 is a perspective view illustrating a television system that incorporates the organic display device pertaining to one aspect of the present invention.

As illustrated in FIG. 24, an organic display device 100 includes the organic display panel 110 and a drive control unit 120 that is connected to the organic display panel 110. The drive control unit 120 includes four drive circuits, namely drive circuits 121 through 124, and a control circuit 125. Here, note that the arrangement of the drive control unit 120 with respect to the organic display panel 110 is not limited to the above-described arrangement when actually implementing the organic display device 100. Similarly, the connection between the drive control unit 120 and the organic display panel 110 is not limited to the above-described connection.

The organic display device 100 having the above-described structure realizes excellent image quality by incorporating organic light-emitting elements having excellent light-emitting characteristics.

[Organic Light-Emitting Device]

FIGS. 26A and 26B illustrate an organic light-emitting device (light-emitting device) pertaining to one aspect of the present invention. More specifically, FIG. 26A is a vertical cross-sectional view of the organic light-emitting device pertaining to one aspect of the present invention, and FIG. 26B is a horizontal cross-sectional view of the organic light-emitting device pertaining to one aspect of the present invention. As illustrated in FIGS. 26A and 26B, an organic light-emitting device 200 includes: a plurality of organic light-emitting elements 210 pertaining to one aspect of the present invention; a base 220 having the organic light-emitting elements 210 mounted on an upper surface thereof; and a pair of reflection members 230 attached to the base 220 with the organic light-emitting elements 210 therebetween. Each of the organic light-emitting elements 210 is electrically connected to a conductive pattern (undepicted) formed on the base 220 and emits light by receiving driving power supplied from the conductive pattern. The reflection members 230 control the distribution of a portion of light emitted from each of the organic light-emitting elements 210.

The organic light-emitting device 200 having the above-described structure has excellent light-emitting characteristics by incorporating organic light-emitting elements having excellent light-emitting characteristics.

[Modifications]

Up to this point, specific explanation has been provided of the ink for an organic light-emitting element, the method for producing the ink, the manufacturing method for an organic light-emitting element, the organic light-emitting element, the organic display device, the organic light-emitting device, the method for forming a functional layer, the functional layer, the display device, and the light-emitting device, each of which pertaining to one aspect of the present invention. However, it should be noted that the above-described embodiment of the present invention has been merely presented for the sole purpose of facilitating explanation of the structure and the effects of the present invention, and therefore, the present invention should not be construed as being limited to such an embodiment.

For instance, the ink for an organic light-emitting element pertaining to one aspect of the present invention may include solutes other than the functional material and/or may include a third solvent other than the first solvent and the second solvent, provided that the characteristics of the first solvent and the second solvent (characteristics related to the shape of the functional layer to be formed) are maintained. The third solvent may be a solvent such that, when the first solvent and the second solvent in the ink is replaced with the third solvent and then a functional layer is formed imitatively, the imitatively formed functional layer has a concave shape or a convex shape. In addition, the ink may include even more types of solvents, including a fourth solvent, a fifth solvent, etc. Further, the ink may also include solutes other than the functional material.

When solvents other than the first solvent and the second solvent are included in the ink, it is exemplary that each of such additional solvents has a boiling point equal or similar to the boiling points of the first solvent and the second solvent, and that the difference in boiling points of such solvents and the first solvent and the second solvent be equal to or smaller than 9° C. Further, it is exemplary that a value γ of the ink satisfy γ=1.9 upon completion of the preparation of the ink.

The ink for an organic light-emitting element pertaining to one aspect of the present invention is not limited to an ink for forming an organic light-emitting layer, and instead, may be an ink for forming a functional layer other than the organic light emitting layer. Examples of a functional layer other than the organic light-emitting layer include: a hole transport layer, an electron transport layer, a hole injection layer, an electron injection layer, a blocking layer and the like. In addition, the ink for an organic light-emitting element pertaining to one aspect of the present invention is not limited to an ink for forming an organic light-emitting element, and instead, may be an ink for forming an inorganic light-emitting element.

The ink for an organic light-emitting element pertaining to one aspect of the present invention may be an ink that is yielded by mixing a plurality of single solvent-type inks having appropriately-adjusted shape-forming characteristics. In the above-described embodiment, an ink for forming a functional layer having a high degree of planarity is prepared by using an exemplary mixed solvent. An exemplary mixed solvent is yielded by mixing a solvent having a characteristic of forming a functional layer having a concave shape when used as the solvent in a single solvent-type ink and a solvent having a characteristic of forming a functional layer having a convex shape when used as the solvent in a single solvent ink, and by appropriately adjusting the mixing ratio at which the solvents are mixed. However, the ink for an organic light-emitting element pertaining to one aspect of the present invention is not limited to such an ink as described above. That is, an ink yielding a functional layer having a high degree of planarity may be prepared (i) by appropriately adjusting the characteristics of a plurality of single solvent-type inks on an individual basis such that a functional layer formed by using each of the single solvent-type inks exhibits planarity, and (ii) by mixing a plurality of such single solvent-type inks whose characteristics have been appropriately adjusted.

More specifically, the adjustment of the characteristics of the solvents is performed in a manner as described in the following. First, when a functional layer formed by using a single solvent-type ink including only one of the solvents exhibits an excessive degree of concavity or convexity, the concentration and/or the molecular amount of the solvent in the single solvent-type ink is adjusted such that the shape of the functional layer is planarized. Following this, the solvent whose concentration or molecular amount in the single solvent-type ink has been adjusted is mixed with one or more other solvents so as to planarize the shape of the functional layer.

For instance, a single solvent-type ink forming a functional layer exhibiting a concave shape can be adjusted so as to form a functional layer exhibiting a comparatively higher degree of planarity by increasing the concentration of the functional material. Here, the concentration of the functional material in the ink can be increased as far as the ink can be properly ejected from the inkjet device. In addition, the functional layer formed by using a single solvent-type ink forming a functional layer exhibiting a concave shape can be convexed by increasing the molecular amount of the functional material included in the ink. On the other hand, a single solvent-type ink forming a functional layer exhibiting a convex shape can be adjusted so as to form a functional layer exhibiting a comparatively higher degree of planarity by decreasing the concentration of the functional material in the ink or by decreasing the molecular amount of the functional material in the ink.

Note that the shape of the functional layer as discussed in the above refers to the shape of the functional layer formed in cases where the ink applied to the base layer is dried immediately following the application thereof. That is, the ink for an organic light-emitting element pertaining to one aspect of the present invention is an ink forming a functional layer having a high degree of planarity when the ink is not left unattended following the application thereof. The time required for manufacturing an organic light-emitting panel can be shortened when a structure is adopted where the ink is not to be left unattended following the application thereof. Accordingly, such a structure is highly efficient in terms of practicability.

The ink for an organic light-emitting element pertaining to one aspect of the present invention is applicable not only to solvent mixture-type inks but also to single solvent-type inks.

That is, the ink for an organic light-emitting element pertaining to one aspect of the present invention may be an ink for an organic light-emitting element including the functional material for forming a functional layer of an organic light-emitting element and a single solvent dissolving the functional material. Such a single solvent-type ink can be expected to realize the same effects as described in the above-described embodiment by setting a value γ of the ink to a value equivalent to 1.9. A value γ indicates a ratio ($\sigma/\eta$) of the surface tension a ($mN \cdot m^{-1}$) of an ink to the viscosity $\eta$ ($mPa \cdot s$) of an ink.

The adjustment of the shape of a functional layer formed by using a single solvent-type ink, or the appropriate setting of a value γ for a single solvent-type ink may appear to be more difficult compared to performing the same adjustment with respect to a solvent mixture-type ink including two or more solvents. However, here it should be noted that, the influence that the surface tension of one or more solvents included in an ink has on the surface tension of the ink is subtle when the ink is a low concentration ink such as an inkjet ink, while the viscosity of the ink is subject to change considerably according to the concentration and/or the molecular amount of the solvents included in the ink. Accordingly, a value γ of a single solvent-type ink can be adjusted to a value approximating 1.9 by controlling the ink viscosity of the single solvent-type ink.

More specifically, the viscosity of a single solvent-type ink can be adjusted by adjusting ink concentration and/or the molecular amount of polymers in the ink. For instance, when a functional layer formed by using a single solvent-type ink exhibits a concave shape, a value γ of the single-solvent ink can be adjusted to approximate a value of 1.9 by increasing the viscosity of the ink by increasing ink concentration and/or increasing the molecular amount of polymers in the ink. In contrast, when a functional layer formed by using a single solvent-type ink exhibits a convex shape, a value γ of the single solvent-type ink can be adjusted to approximate a value of 1.9 by decreasing the viscosity of the ink by decreasing ink concentration and/or decreasing the molecular amount of polymers in the ink.

The shape of the functional layer formed by using a single solvent-type ink can also be planarized as explained above.

The above-described single solvent-type ink for an organic light-emitting element can be produced according to the method for producing the single solvent-type ink presented in the following.

A method for producing such a single solvent-type ink comprises: a first step of preparing an imitatively formed ink by mixing a functional material that forms a functional layer of an organic light-emitting element and a solvent that is soluble in the functional material; a second step of calculating a surface tension σ (mN·m$^{-1}$) of the imitatively formed ink; a third step of calculating a viscosity η of the single solvent-type ink that renders a value γ of the single solvent-type ink to a value equivalent to 1.9, the value γ indicating a ratio (σ/η) of a surface tension σ (mN·m$^{-1}$) of the single solvent-type ink to the viscosity η (mPa·s) of the single solvent-type ink; a fourth step of calculating a concentration of the single solvent-type ink according to the viscosity η so calculated and the relation between the viscosity η and the concentration of the single solvent-type ink; and a fifth step of preparing the single solvent-type ink by mixing the functional material and the solvent such that the single solvent-type ink has the concentration so calculated.

From the results illustrated in FIG. 15, it is considered exemplary that the value γ be a value greater than 1.87 and smaller than 1.94 for both single solvent-type and solvent mixture-type inks. Further, a value γ within this range between 1.87 and 1.94 is considered as being equivalent to 1.9.

The organic light-emitting element pertaining to one aspect of the present invention is not limited to a top emission type organic light-emitting element, and may also be a bottom emission type organic light-emitting element. In addition, although no description has been provided in the embodiment of the present invention concerning the color of light emitted by the organic light-emitting layer of the organic light-emitting element pertaining to one aspect of the present invention included in an organic display device, the organic display device is not limited to that having only monochromatic display capability, and the organic display device may have full-color display capability. In an organic display device having a full-color display capability, one organic light-emitting element corresponds to one subpixel corresponding to one color among the colors R, G, and B. A pixel is formed by a combination of three adjacent subpixels corresponding to the colors R, G, and B, and a plurality of such pixels are arranged in a matrix to form an image display region.

INDUSTRIAL APPLICABILITY

The ink for an organic light-emitting element of pertaining to one aspect of the present invention is widely applicable in a manufacturing process of an organic light-emitting element involving application of the wet process. In addition, the organic light-emitting element of pertaining to one aspect of the present invention is widely and generally applicable in, for example, the field of passive matrix-type and active matrix-type organic display devices and organic light-emitting devices.

REFERENCE SIGNS LIST 1 substrate
2, 3 anode electrode
4 hole injection layer
5 banks
6 hole transport layer
7 organic light-emitting layer
8 electron transport layer
9 cathode electrode
10 encapsulation layer
100 organic display device
110 organic display panel
111, 210 organic light-emitting element
112 sealing member
113 color filter substrate
120 drive control unit
121-124 drive circuit
125 control circuit
200 organic light-emitting device
220 base
230 reflection member

The invention claimed is:
1. An ink for an organic light-emitting element, the ink comprising:
a first solvent;
a second solvent that differs from the first solvent;
a third solvent that differs from the first and second solvents; and
a functional material that is soluble in the first solvent and the second solvent and that forms a functional layer of the organic light-emitting element, wherein
the first solvent is a solvent such that when the second and third solvents are replaced with the first solvent and then a functional layer is formed imitatively, the imitatively formed functional layer has, in a light-emitting region of an organic light-emitting element, a shape such that the functional layer is thicker at both end portions than at a central portion and the top surfaces of the end portions are positioned higher than the top surface of the central portion,
the second solvent is a solvent such that when the first and third solvents are replaced with the second solvent and then a functional layer is formed imitatively, the imitatively formed functional layer has, in a light-emitting region of an organic light-emitting element, a shape such that the functional layer is thicker at a central portion than at both end portions and the top surface of the central portion is positioned higher than the top surfaces of the end portions,
one of the first solvent and the second solvent has a higher boiling point and a higher viscosity than the other one of the first solvent and the second solvent, and
a boiling point of the third solvent is no more than 9° C. different from that of the first and that of the second solvent.

2. The ink for an organic light-emitting element of claim 1, wherein
the first solvent and the second solvent are mixed in a mixing ratio such that the level of the top surface of the functional layer will become uniform throughout from the end portions to the central portion and the thickness of the functional layer will become uniform from the end portions to the central portion.

3. The ink for an organic light-emitting element of claim 1, wherein
the boiling point of the second solvent is higher than the boiling point of the first solvent.

4. The ink for an organic light-emitting element of claim 1, wherein
when the ratio ($\sigma/\eta$) of the surface tension $\sigma$ (mN·m$^{-1}$) of an ink to the viscosity $\eta$ (mPa·s) of the ink is $\gamma$,
the ink imitatively prepared by replacing the second and third solvents with the first solvent satisfies $\gamma > 1.9$, and
the ink imitatively prepared by replacing the first and third solvents with the second solvent satisfies $\gamma > 1.9$.

5. The ink for an organic light-emitting element of claim 1, wherein
each of the end portions of the functional layer is an area of the light-emitting region corresponding to a distance of 12.5% of the entire length of the light-emitting region from a corresponding end of the light-emitting region towards the center of the light-emitting region, and
the central portion of the functional layer is an area corresponding to the center of the light-emitting region.

6. The ink for an organic light-emitting element of claim 1, wherein
the first solvent is cyclohexylbenzene,
the second solvent is 1-methylnaphthalene, and
the functional material is F8-F6.

7. The ink for an organic light-emitting element of claim 1, wherein
the first solvent is heptylbenzene,
the second solvent is 1-methylnaphthalene, and
the functional material is F8-F6.

8. The ink for an organic light-emitting element of claim 1, wherein
the functional material is an organic light-emitting material.

9. An ink for an organic light-emitting element, the ink comprising:
a first solvent;
a second solvent that differs from the first solvent;
a third solvent that differs from the first and second solvents; and
a functional material that is soluble in the first solvent and the second solvent and that forms a functional layer of the organic light-emitting element, wherein
when the ratio ($\sigma/\eta$) of the surface tension $\sigma$ (mN·m$^{-1}$) of the ink to the viscosity $\eta$ (mPa·s) of the ink is $\gamma$,
an ink imitatively prepared by replacing the second and third solvents with the first solvent satisfies $\gamma > 1.9$,
an ink imitatively prepared by replacing the first and third solvents with the second solvent satisfies $\gamma < 1.9$,
one of the first solvent and the second solvent has a higher boiling point and a higher viscosity than the other one of the first solvent and the second solvent, and
a boiling point of the third solvent is no more than 9° C. different from that of the first and that of the second solvent.

10. The ink for an organic light-emitting element of claim 9, wherein
the functional material, the first solvent, and the second solvent are mixed so that $\gamma$ satisfies $\gamma = 1.9$ when the functional material, the first solvent, and the second solvent are mixed.

11. The ink for an organic light-emitting element of claim 9, wherein
the first solvent and the second solvent are mixed in a mixing ratio such that the level of the top surface of the functional layer will become uniform throughout from the end portions to the central portion and the thickness of the functional layer will become uniform from the end portions to the central portion.

12. The ink for an organic light-emitting element of claim 9, wherein
the boiling point of the second solvent is higher than the boiling point of the first solvent.

13. The ink for an organic light-emitting element of claim 9, wherein
each of the end portions of the functional layer is an area of the light-emitting region corresponding to a distance of 12.5% of the entire length of the light-emitting region from a corresponding end of the light-emitting region towards the center of the light-emitting region, and
the central portion of the functional layer is an area corresponding to the center of the light-emitting region.

14. The ink for an organic light-emitting element of claim 9, wherein
the first solvent is cyclohexylbenzene,
the second solvent is 1-methylnaphthalene, and
the functional material is F8-F6.

15. The ink for an organic light-emitting element of claim 9, wherein
the first solvent is heptylbenzene,
the second solvent is 1-methylnaphthalene, and
the functional material is F8-F6.

16. The ink for an organic light-emitting element of claim 9, wherein
the functional material is an organic light-emitting material.

17. A method for producing an ink for an organic light-emitting element, the ink including a first solvent, a second solvent that differs from the first solvent, a third solvent that differs from the first and second solvents, and a functional material that is soluble in the first solvent and the second solvent and that forms a functional layer of the organic light-emitting element, the method comprising:
providing the first solvent, the second solvent, the third solvent, and the functional material; and
mixing the first solvent, the second solvent, the third solvent, and the functional material, wherein
the first solvent is a solvent such that when the second and third solvents are replaced with the first solvent and then a functional layer is formed imitatively, the imitatively formed functional layer has, in a light-emitting region of an organic light-emitting element, a shape such that the functional layer is thicker at both end portions than at a central portion and the top surfaces of the end portions are positioned higher than the top surface of the central portion, the second solvent is a solvent such that when the first and third solvents are replaced with the second solvent and then a functional layer is formed imitatively, the imitatively formed functional layer has, in a light-emitting region of an organic light-emitting element, a shape such that the functional layer is thicker at a central portion than at both end portions and the top surface of the central portion is positioned higher than the top surfaces of the end portions, one of the first solvent and the second solvent has a higher boiling point and a higher viscosity than the other one of the first solvent and the second solvent, and a boiling point of the third solvent is no more than 9° C. different from that of the first and that of the second solvent.

18. A method for producing an ink for an organic light-emitting element, the ink including a first solvent, a second solvent that differs from the first solvent, a third solvent that differs from the first and second solvent, and a functional material that is soluble in the first solvent and the second solvent and that forms a functional layer of the organic light-emitting element, the manufacturing method comprising:

providing the first solvent, the second solvent, the third solvent, and the functional material; and mixing the first solvent, the second solvent, the third solvent, and the functional material, wherein when the ratio ($\sigma/\eta$) of the surface tension $\sigma$ (mN·m$^{-1}$) of the ink to the viscosity $\eta$ (mPa·s) of the ink is $\gamma$, the first solvents is a solvent such that an ink imitatively prepared by replacing the second and third solvent with the first solvent satisfies $\gamma > 1.9$, the second solvent is a solvent such that an ink imitatively prepared by replacing the first and third solvents with the second solvent satisfies $\gamma < 1.9$, one of the first solvent and the second solvent has a higher boiling point and a higher viscosity than the other one of the first solvent and the second solvent, and a boiling point of the third solvent is no more than 9° C. different from that of the first and that of the second solvent.

\* \* \* \* \*